US010476124B2

(12) United States Patent
Holt

(10) Patent No.: US 10,476,124 B2
(45) Date of Patent: Nov. 12, 2019

(54) RADIO FREQUENCY POWER SENSOR HAVING A NON-DIRECTIONAL COUPLER

(71) Applicant: BIRD TECHNOLOGIES GROUP INC, Solon, OH (US)

(72) Inventor: Timothy L. Holt, Chardon, OH (US)

(73) Assignee: Bird Technologies Group Inc., Solon, OH (US)

(*) Notice: Subject to any disclaimer, the term of this patent is extended or adjusted under 35 U.S.C. 154(b) by 262 days.

(21) Appl. No.: 15/567,361

(22) PCT Filed: Apr. 18, 2016

(86) PCT No.: PCT/US2016/028182

§ 371 (c)(1),
(2) Date: Oct. 17, 2017

(87) PCT Pub. No.: WO2016/168861

PCT Pub. Date: Oct. 20, 2016

(65) Prior Publication Data

US 2018/0090809 A1 Mar. 29, 2018

Related U.S. Application Data

(60) Provisional application No. 62/149,502, filed on Apr. 17, 2015.

(51) Int. Cl.
*H01P 5/02* (2006.01)
*H03H 11/24* (2006.01)
(Continued)

(52) U.S. Cl.
CPC ................ *H01P 5/085* (2013.01); *H01P 3/00* (2013.01); *H01P 5/107* (2013.01); *H01P 5/184* (2013.01)

(58) Field of Classification Search
CPC ..... H01P 5/00; H01P 5/18; H01P 1/22; G01R 15/16; H03H 11/24
(Continued)

(56) References Cited

U.S. PATENT DOCUMENTS 3,829,770 A 8/1974 Stevens
4,034,289 A 7/1977 Rozylowicz
(Continued)

FOREIGN PATENT DOCUMENTS

CN 202009381 10/2011
EP 2762268 8/2014
(Continued)

OTHER PUBLICATIONS

Gerling, "Waveguide components and configurations for optimal performance in microwave heating systems", Internet Citation, 2000, pp. 1-8, XP002691931, http://www.rfdh.com/ez/system/db/lib a pp/upload/1774/%5BGerling%5D waveguide components and configurations for optimal_performance_in_microwave_heating_systems.pdf.
(Continued)

*Primary Examiner* — Dean O Takaoka
(74) *Attorney, Agent, or Firm* — Wegman Hessler

(57) ABSTRACT

Disclosed is a capacitive non-directional coupler having a non-directional coupler printed circuit board (PCB) and a capacitive attenuator. The non-directional coupler PCB includes a coupler section configured to carry energy travelling on a main transmission line. The non-directional coupler PCB and the capacitive attenuator are configured as a capacitive voltage divider, and provide a sample of the energy on the main transmission line. Also disclosed is a method for measuring for measuring RF power using an RF power sensor having the capacitive non-directional coupler that includes with the non-directional coupler printed circuit
(Continued)

board and the capacitive attenuator. Also disclosed is an RF power metering system that includes an RF power sensor having the capacitive non-directional coupler.

20 Claims, 20 Drawing Sheets

(51) Int. Cl.

| | |
|---|---|
| ***G01R 15/16*** | (2006.01) |
| ***H01P 5/08*** | (2006.01) |
| ***H01P 3/00*** | (2006.01) |
| ***H01P 5/107*** | (2006.01) |
| ***H01P 5/18*** | (2006.01) |

(58) Field of Classification Search
USPC .......... 333/24 R, 24.2, 24 C, 81 R; 324/126; 307/15
See application file for complete search history.

(56) References Cited

U.S. PATENT DOCUMENTS

| | | | |
|---|---|---|---|
| 4,070,619 | A | 1/1978 | Trefney |
| 4,150,345 | A | 4/1979 | Goldman |
| 4,476,447 | A | 10/1984 | Lauchner |
| 4,795,989 | A | 1/1989 | Hart |
| 5,486,798 | A | 1/1996 | Veitschegger |
| 5,767,753 | A | 6/1998 | Ruelke |
| 6,437,661 | B2 | 8/2002 | Nishimura |
| 6,542,375 | B1 | 4/2003 | Kuitenbrouwer |
| 6,650,178 | B1 | 11/2003 | Brankovic |
| 6,686,812 | B2 | 2/2004 | Gilbert |
| 6,972,639 | B2 | 12/2005 | Podell |
| 7,132,906 | B2 | 11/2006 | Podell |
| 7,245,192 | B2 | 7/2007 | Podell |
| 7,375,603 | B2 | 5/2008 | Dupont |
| 7,821,354 | B2 | 10/2010 | Niiranen |
| 8,169,277 | B2 | 5/2012 | McIntyre |
| 8,620,606 | B2 | 12/2013 | Holt |
| 2001/0003434 | A1 | 6/2001 | Mu |
| 2004/0100330 | A1 | 5/2004 | Chandler |
| 2005/0122186 | A1 | 6/2005 | Podell |
| 2008/0158090 | A1 | 7/2008 | Dupont |
| 2011/0063169 | A1 | 3/2011 | Chen |
| 2013/0201006 | A1 | 8/2013 | Kummetz |
| 2014/0015547 | A1 | 1/2014 | Bottomley |
| 2014/0152294 | A1 | 6/2014 | Holt |

FOREIGN PATENT DOCUMENTS

| | | |
|---|---|---|
| WO | 0064072 | 10/2000 |
| WO | 0163791 | 8/2001 |

OTHER PUBLICATIONS

International Search Report and Written Opinion for International Patent Application No. PCT/US2016/028182 dated Oct. 31, 2016.

RADIO FREQUENCY POWER SENSOR HAVING A NON-DIRECTIONAL COUPLER

CROSS-REFERENCE TO RELATED APPLICATIONS

This application is the US National phase entry of International Patent Application No. PCT/US2016/028182 filed Apr. 18, 2016, which claims priority to U.S. Provisional Patent Application Ser. No. 62/149,502, filed Apr. 17, 2015, and titled RADIO FREQUENCY POWER SENSOR HAVING A NON-DIRECTIONAL COUPLER, all of the above listed applications are incorporated by reference herein.

FIELD OF THE INVENTION

This application is directed to radio frequency (RF) power measurement. More specifically, to an RF power sensor having a non-directional coupler.

BACKGROUND OF THE INVENTION

There are many applications within the radio communications industry, where it is desired to measure the power that is present within a transmission line structure. This increases the need for RF power sensors.

BRIEF SUMMARY OF THE INVENTION

According to one aspect of the present invention, a capacitive non-directional coupler is provided. The capacitive non-directional coupler having a non-directional coupler printed circuit board (PCB) and a capacitive attenuator; the non-directional coupler PCB is comprised of a coupler section configured to carry energy travelling on a main transmission line; wherein the non-directional coupler PCB and the capacitive attenuator are configured as a capacitive voltage divider and provide a sample of the energy on the main transmission line.

In another aspect of the invention, the coupler section is a microstripline.

In another aspect of the invention, a front side of the non-directional coupler PCB has the coupler section, a reverse side of the non-directional coupler PCB has a printed metallic structure, and a di-electric material is located between the coupler section and the printed metallic structure; at least a portion of the coupler section and the printed metallic structure overlap; and the coupler section and the printed metallic structure are configured to couple when the RF power is present on the coupler section.

In another aspect of the invention, the capacitive attenuator is electrically connected to the printed metallic structure and configured as a shunt capacitor.

In another aspect of the invention, a power transfer member electrically connects the printed metallic structure and the capacitive attenuator.

In another aspect of the invention, the capacitive non-directional coupler includes a power transfer member configured to electrically connect the printed metallic structure and the capacitive attenuator.

In another aspect of the invention, the capacitive attenuator is located at a base of the power transfer member and a distal end of the power transfer member is electrically connected to the printed metallic structure.

In another aspect of the invention, the capacitive non-directional coupler includes a power transfer member configured to electrically connect the printed metallic structure and the capacitive attenuator, wherein the capacitive attenuator is located at a base of the power transfer member and a distal end of the power transfer member contacts the printed metallic structure.

In another aspect of the invention, the printed metallic structure is a circular dot.

In another aspect of the invention, the power transmission member is flexible.

In another aspect of the invention, the capacitive attenuator is a distributed capacitor.

In another aspect of the invention, the printed metallic structure has a diameter of 0.125 inches.

In another aspect of the invention, a length of the non-directional coupler PCB is about 0.3 inches and the width of the non-directional coupler PCB is about 0.4 inches.

In another aspect of the invention, a thickness of the non-directional coupler PCB di-electric material is about 0.020 inches.

In another aspect of the invention, the coupler section has a width of about 0.050 inches and a length of about 0.300 inches.

In another aspect of the invention, the power transmission member is a wire.

In another aspect of the invention, the power transmission member is a pin.

In another aspect of the invention, the power transmission member is a telescoping pin.

In a further aspect of the invention, a radio frequency (RF) power sensor includes: a non-directional coupler and an analog processing circuit; the non-directional coupler is a capacitive non-directional coupler and comprised of a non-directional coupler printed circuit board (PCB) and a capacitive attenuator; the non-directional coupler PCB is comprised of a coupler section configured to carry energy travelling on a main transmission line; wherein the non-directional coupler PCB and the capacitive attenuator are configured as a capacitive voltage divider and provide a sample of the energy on the main transmission line.

In another aspect of the invention, the coupler section is a microstripline.

In another aspect of the invention, a front side of the non-directional coupler PCB is includes of the coupler section, a reverse side of the non-directional coupler PCB is comprised of a printed metallic structure, and a di-electric material located between the coupler section and the printed metallic structure; at least a portion of the coupler section and the printed metallic structure overlap; and the coupler section and the printed metallic structure are configured to couple when the RF power is present on the coupler section.

In another aspect of the invention, the capacitive attenuator is electrically connected to the printed metallic structure and configured as a shunt capacitor.

In another aspect of the invention, a power transfer member electrically connects the printed metallic structure and the capacitive attenuator.

In another aspect of the invention, the RF power sensor further includes a power transfer member configured to electrically connect the printed metallic structure and the capacitive attenuator, wherein the capacitive attenuator is located at a base of the power transfer member and a distal end of the power transfer member is electrically connected to the printed metallic structure.

In another aspect of the invention, the RF power sensor further includes a power transfer member configured to electrically connect the printed metallic structure and the capacitive attenuator, wherein the capacitive attenuator is located at a base of the power transfer member and a distal end of the power transfer member contacts the printed metallic structure.

In another aspect of the invention, the printed metallic structure is a circular dot.

In another aspect of the invention, the power transmission member is flexible.

In another aspect of the invention, the capacitive attenuator is a distributed capacitor.

In another aspect of the invention, the printed metallic structure has a diameter of 0.125 inches.

In another aspect of the invention, a length of the non-directional coupler PCB is about 0.3 inches and the width of the non-directional coupler PCB is about 0.4 inches.

In another aspect of the invention, a thickness of the non-directional coupler PCB di-electric material is about 0.020 inches.

In another aspect of the invention, the coupler section has a width of about 0.050 inches and a length of about 0.300 inches.

In another aspect of the invention, the power transmission member is a wire.

In another aspect of the invention, the power transmission member is a pin.

In another aspect of the invention, the power transmission member is a telescoping pin.

In another aspect of the invention, the analog processing circuit is configured to receive the sample of the energy on the main transmission line and covert the sample of energy to a DC voltage for output.

In another aspect of the invention, the DC voltage is a scaled DC voltage representative of the energy travelling on the main transmission line.

In another aspect of the invention, the analog processing circuit is comprised of a resistive attenuator, a square law detector, a first analog gain stage, a second analog gain stage, and a port; the resistive attenuator is configured to receive the sample of the energy on the main transmission line from the capacitive non-directional coupler and convert the sample of the energy to an attenuated sample of energy; the square law detector is configured to receive the attenuated sample of the energy and convert the attenuated sample of the energy to an analog DC voltage; the first analog gain stage is configured to receive the analog DC voltage, apply a gain with a temperature correction to the analog DC voltage, thereby producing a temperature corrected DC voltage; the amount of temperature correction applied by the first analog gain stage is determined by an output of a temperature compensation circuit; the second analog gain stage is configured to receive and scale the temperature corrected DC voltage, thereby producing a scaled DC voltage; and the port is configured to receive the scaled DC voltage and output the scaled DC voltage.

In a further aspect of the invention, a method of using a radio frequency (RF) power sensor includes: providing an RF power sensor and a main transmission line, the RF power sensor is comprised of a non-directional coupler and an analog processing circuit; connecting the RF power sensor to the main transmission line; and obtaining a sample of energy on the main transmission line using the non-directional coupler.

In another aspect of the invention, the non-directional coupler is a capacitive non-directional coupler and comprised of a non-directional coupler printed circuit board (PCB) and a capacitive attenuator; the non-directional coupler PCB is includes a coupler section configured to carry the energy on the main transmission line; and the non-directional coupler PCB and the capacitive attenuator are configured as a capacitive voltage divider and provide the sample of the energy on the main transmission line.

In another aspect of the invention, the method further includes converting the sample of the energy to a scaled DC voltage representative of the energy travelling on the main transmission line and outputting the scaled DC voltage.

In another aspect of the invention, the coupler section is a microstripline.

In another aspect of the invention, a front side of the non-directional coupler PCB includes of the coupler section, a reverse side of the non-directional coupler PCB includes a printed metallic structure, and a di-electric material is located between the coupler section and the printed metallic structure; at least a portion of the coupler section and the printed metallic structure overlap; and the coupler section and the printed metallic structure are configured to couple when the RF power is present on the coupler section.

In another aspect of the invention, the capacitive attenuator is electrically connected to the printed metallic structure and configured as a shunt capacitor.

In another aspect of the invention, a power transfer member electrically connects the printed metallic structure and the capacitive attenuator.

In another aspect of the invention, the RF power sensor further includes a power transfer member configured to electrically connect the printed metallic structure and the capacitive attenuator, wherein the capacitive attenuator is located at a base of the power transfer member and a distal end of the power transfer member is electrically connected to the printed metallic structure.

In another aspect of the invention, the RF power sensor further comprises a power transfer member configured to electrically connect the printed metallic structure and the capacitive attenuator, wherein the capacitive attenuator is located at a base of the power transfer member and a distal end of the power transfer member contacts the printed metallic structure.

In another aspect of the invention, the printed metallic structure is a circular dot.

In another aspect of the invention, the power transmission member is flexible.

In another aspect of the invention, the capacitive attenuator is a distributed capacitor.

In another aspect of the invention, the printed metallic structure has a diameter of 0.125 inches.

In another aspect of the invention, a length of the non-directional coupler PCB is about 0.3 inches and the width of the non-directional coupler PCB is about 0.4 inches.

In another aspect of the invention, a thickness of the non-directional coupler PCB di-electric material is about 0.020 inches.

In another aspect of the invention, the coupler section has a width of about 0.050 inches and a length of about 0.300 inches.

In another aspect of the invention, the power transmission member is a wire.

In another aspect of the invention, the power transmission member is a pin.

In another aspect of the invention, the power transmission member is a telescoping pin.

In another aspect of the invention, the analog processing circuit is configured to receive the sample of the energy on the main transmission line and covert the sample of energy to a DC voltage for output.

In another aspect of the invention, the DC voltage is a scaled DC voltage representative of the energy travelling on the main transmission line.

In another aspect of the invention, the analog processing circuit is comprised of a resistive attenuator, a square law detector, a first analog gain stage, a second analog gain stage, a temperature compensation circuit, and a port;

In another aspect of the invention, wherein the method further includes converting the attenuated sample of the energy to an analog DC voltage using the square law detector; converting the analog DC voltage to a temperature corrected DC voltage by applying a gain and a temperature correction to the analog DC voltage using the first analog gain stage, the gain of the first analog gain stage is determined by an output of the temperature compensation circuit; converting the temperature corrected DC voltage to a scaled DC voltage using the second analog gain stage; and outputting the scaled DC voltage using the port.

In a further aspect of the invention, an RF power monitoring system includes a first input power sensor, an output power sensor, and a channel power meter; the first input power sensor is configured to measure a pre-combiner RF power level for the first channel on a first channel transmission line and provide the measured pre-combiner RF power level for the first channel to the channel power meter; the second input power sensor is configured to measure a pre-combiner RF power level for the second channel on a second channel transmission line and provide the measured pre-combiner RF power level for the second channel to the channel power meter; the output power sensor is configured to measure the post-combiner RF power level for the first channel on a combined channel transmission line and provide the measured post-combiner RF power level for the first channel to the channel power meter; and the output sensor is further configured to measure the post-combiner RF power level for the second channel on a combined channel transmission line and provide the measured post-combiner RF power level for the second channel to the channel power meter.

In another aspect of the invention, the channel power meter is configured to determine a combiner loss level for the first channel by calculating the difference between the pre-combiner RF power level for the first channel and the post-combiner RF power level for the first channel.

In another aspect of the invention, the channel power meter is further configured to determine a combiner loss level for the second channel by calculating the difference between the pre-combiner RF power level for the second channel and the post-combiner RF power level for the second channel.

In another aspect of the invention, the channel power meter is further configured to display at least one of the combiner loss level for the first channel and/or the combiner loss level for the second channel.

In another aspect of the invention, at least one of the first input power sensor and/or the second input power sensor is an RF power sensor with a capacitive non-directional coupler.

In another aspect of the invention, the capacitive non-directional coupler includes: a non-directional coupler printed circuit board (PCB) and a capacitive attenuator; the non-directional coupler PCB is comprised of a coupler section configured to carry energy travelling on a main transmission line, wherein the main transmission line can be the first channel transmission line or the second channel transmission line; wherein the non-directional coupler PCB and the capacitive attenuator are configured as a capacitive voltage divider and provide a sample of the energy on the main transmission line.

In another aspect of the invention, the coupler section is a microstrip.

In another aspect of the invention, a front side of the non-directional coupler PCB includes the coupler section, a reverse side of the non-directional coupler PCB is comprised of a printed metallic structure, and a di-electric material located between the coupler section and the printed metallic structure; at least a portion of the coupler section and the printed metallic structure overlap; and the coupler section and the printed metallic structure are configured to couple when the RF power is present on the coupler section.

In another aspect of the invention, the capacitive attenuator is electrically connected to the printed metallic structure and configured as a shunt capacitor.

In another aspect of the invention, a power transfer member electrically connects the printed metallic structure and the capacitive attenuator.

In another aspect of the invention, a power transfer member configured to electrically connect the printed metallic structure and the capacitive attenuator, wherein the capacitive attenuator is located at a base of the power transfer member and a distal end of the power transfer member is electrically connected to the printed metallic structure.

In another aspect of the invention, the capacitive non-directional coupler further includes a power transfer member configured to electrically connect the printed metallic structure and the capacitive attenuator, wherein the capacitive attenuator is located at a base of the power transfer member and a distal end of the power transfer member is electrically connected to the printed metallic structure.

In another aspect of the invention, the capacitive non-directional coupler further includes a power transfer member configured to electrically connect the printed metallic structure and the capacitive attenuator, wherein the capacitive attenuator is located at a base of the power transfer member and a distal end of the power transfer member contacts the printed metallic structure.

In another aspect of the invention, the printed metallic structure is a circular dot.

In another aspect of the invention, the power transmission member is flexible.

In another aspect of the invention, the capacitive attenuator is a distributed capacitor.

In another aspect of the invention, the power transmission member is a wire.

In another aspect of the invention, the power transmission member is a pin.

In another aspect of the invention, the power transmission member is a telescoping pin.

In a further aspect of the invention, a non-transitory computer-readable storage medium storing executable code for determining a combiner loss level for a channel, the code when executed performs the steps including: receiving a measured pre-combiner RF power level for a first channel from a first input power sensor; receiving a measured post-combiner RF power level for the first channel from an output power sensor; determining a first channel combiner RF power loss level by calculating a difference between the measured pre-combiner RF power level for the first channel and the measured post-combiner RF power level for the first channel; and outputting the first channel combiner power loss level.

In another aspect of the invention, the code when executed further performs the steps including: receiving a measured pre-combiner RF power level for a second channel from a second input power sensor; receiving a measured post-combiner RF power level for the second channel from an output power sensor; determining a second channel combiner RF power loss level by calculating a difference between the measured pre-combiner RF power level for the second channel and the measured post-combiner RF power level for the second channel; and outputting the second channel combiner power loss level.

In another aspect of the invention, wherein at least one of the first input power sensor and/or the second input power sensor is an RF power sensor with a capacitive non-directional coupler.

In another aspect of the invention, wherein the capacitive non-directional coupler includes: a non-directional coupler printed circuit board (PCB) and a capacitive attenuator; the non-directional coupler PCB is comprised of a coupler section configured to carry energy travelling on a main transmission line, wherein the main transmission line can be the first channel transmission line or the second channel transmission line; wherein the non-directional coupler PCB and the capacitive attenuator are configured as a capacitive voltage divider and provide a sample of the energy on the main transmission line.

In another aspect of the invention, the coupler section is a microstrip.

In another aspect of the invention, a front side of the non-directional coupler PCB is comprised of the coupler section, a reverse side of the non-directional coupler PCB is comprised of a printed metallic structure, and a di-electric material located between the coupler section and the printed metallic structure; at least a portion of the coupler section and the printed metallic structure overlap; and the coupler section and the printed metallic structure are configured to couple when the RF power is present on the coupler section.

In another aspect of the invention, the capacitive attenuator is electrically connected to the printed metallic structure and configured as a shunt capacitor.

In another aspect of the invention, a power transfer member electrically connects the printed metallic structure and the capacitive attenuator.

In another aspect of the invention, a power transfer member configured to electrically connect the printed metallic structure and the capacitive attenuator, wherein the capacitive attenuator is located at a base of the power transfer member and a distal end of the power transfer member is electrically connected to the printed metallic structure.

In another aspect of the invention, the capacitive non-directional coupler further comprises a power transfer member configured to electrically connect the printed metallic structure and the capacitive attenuator, wherein the capacitive attenuator is located at a base of the power transfer member and a distal end of the power transfer member is electrically connected to the printed metallic structure.

In another aspect of the invention, the capacitive non-directional coupler further comprises a power transfer member configured to electrically connect the printed metallic structure and the capacitive attenuator, wherein the capacitive attenuator is located at a base of the power transfer member and a distal end of the power transfer member contacts the printed metallic structure.

In another aspect of the invention, the printed metallic structure is a circular dot.

In another aspect of the invention, the power transmission member is flexible.

In another aspect of the invention, the capacitive attenuator is a distributed capacitor.

In another aspect of the invention, the power transmission member is a wire.

In another aspect of the invention, the power transmission member is a pin.

In another aspect of the invention, the power transmission member is a telescoping pin.

Advantages of the present invention will become more apparent to those skilled in the art from the following description of the embodiments of the invention which have been shown and described by way of illustration. As will be realized, the invention is capable of other and different embodiments, and its details are capable of modification in various respects.

BRIEF DESCRIPTION OF SEVERAL VIEWS OF THE DRAWINGS

These and other features of the present invention, and their advantages, are illustrated specifically in embodiments of the invention now to be described, by way of example, with reference to the accompanying diagrammatic drawings, in which.

Figure 1:
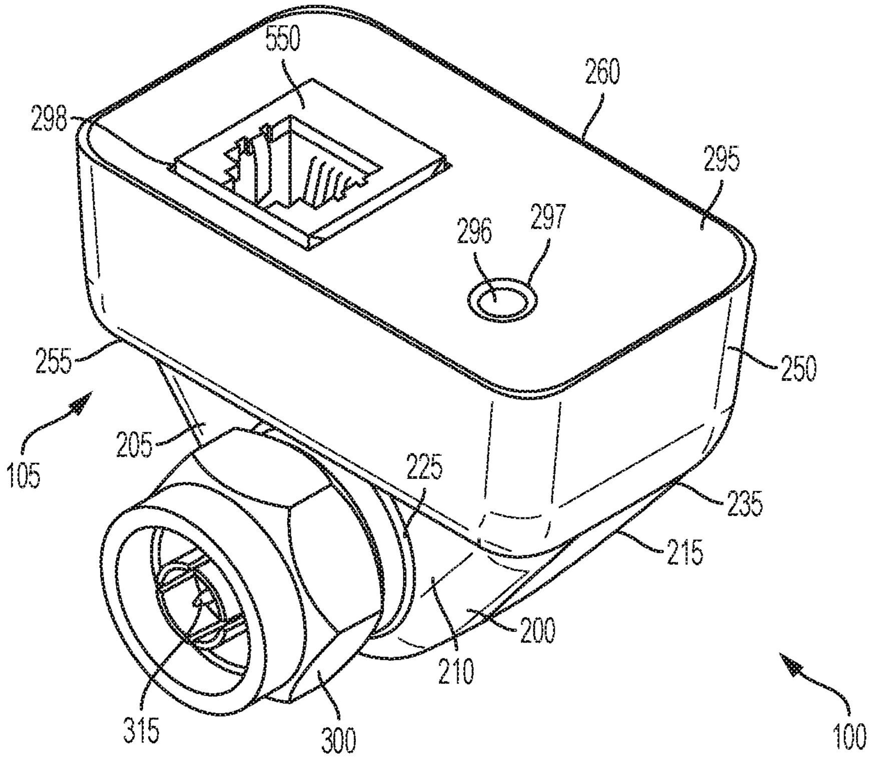
FIG. 1 is an isometric view of an RF power sensor having a non-directional coupler in accordance with an exemplary embodiment of the invention.

It should be noted that all the drawings are diagrammatic and not drawn to scale. Relative dimensions and proportions of parts of these figures have been shown exaggerated or reduced in size for the sake of clarity and convenience in the drawings. The same reference numbers are generally used to refer to corresponding or similar features in the different embodiments. Accordingly, the drawing(s) and description are to be regarded as illustrative in nature and not as restrictive.

DETAILED DESCRIPTION OF THE PREFERRED EMBODIMENT

Approximating language, as used herein throughout the specification and claims, may be applied to modify any quantitative representation that could permissibly vary without resulting in a change in the basic function to which it is related. Accordingly, a value modified by a term or terms, such as "about", is not limited to the precise value specified. In at least some instances, the approximating language may correspond to the precision of an instrument for measuring the value. Range limitations may be combined and/or interchanged, and such ranges are identified and include all the sub-ranges stated herein unless context or language indicates otherwise. Other than in the operating examples or where otherwise indicated, all numbers or expressions referring to quantities of ingredients, reaction conditions and the like, used in the specification and the claims, are to be understood as modified in all instances by the term "about".

"Optional" or "optionally" means that the subsequently described event or circumstance may or may not occur, or that the subsequently identified material may or may not be present, and that the description includes instances where the event or circumstance occurs or where the material is present, and instances where the event or circumstance does not occur or the material is not present.

As used herein, the terms "comprises", "comprising", "includes", "including", "has", "having", or any other variation thereof, are intended to cover a non-exclusive inclusion. For example, a process, method, article or apparatus that comprises a list of elements is not necessarily limited to only those elements, but may include other elements not expressly listed or inherent to such process, method, article, or apparatus.

The singular forms "a", "an", and "the" include plural referents unless the context clearly dictates otherwise.

A "processor", as used herein, processes signals and performs general computing and arithmetic functions. Signals processed by the processor can include digital signals, data signals, computer instructions, processor instructions, messages, a bit, a bit stream, or other means that can be received, transmitted and/or detected. Generally, the processor can be a variety of various processors including multiple single and multicore processors and co-processors and other multiple single and multicore processor and co-processor architectures. The processor can include various modules to execute various functions.

A "memory", as used herein can include volatile memory and/or nonvolatile memory. Non-volatile memory can include, for example, ROM (read only memory), PROM (programmable read only memory), EPROM (erasable PROM), and EEPROM (electrically erasable PROM). Volatile memory can include, for example, RAM (random access memory), synchronous RAM (SRAM), dynamic RAM (DRAM), synchronous DRAM (SDRAM), double data rate SDRAM (DDRSDRAM), and direct RAM bus RAM (DRRAM). The memory can also include a disk. The memory can store an operating system that controls or allocates resources of a computing device. The memory can also store data for use by the processor.

A "disk", as used herein can be, for example, a magnetic disk drive, a solid state disk drive, a floppy disk drive, a tape drive, a Zip drive, a flash memory card, and/or a memory stick. Furthermore, the disk can be a CD-ROM (compact disk ROM), a CD recordable drive (CD-R drive), a CD rewritable drive (CD-RW drive), and/or a digital video ROM drive (DVD ROM). The disk can store an operating system and/or program that controls or allocates resources of a computing device.

Some portions of the detailed description that follows are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps (instructions) leading to a desired result. The steps are those requiring physical manipulations of physical quantities. Usually, though not necessarily, these quantities take the form of electrical, magnetic or optical non-transitory signals capable of being stored, transferred, combined, compared and otherwise manipulated. It is convenient at times, principally for reasons of common usage, to refer to these signals as bits, values, elements, symbols, characters, terms, numbers, or the like. Furthermore, it is also convenient at times, to refer to certain arrangements of steps requiring physical manipulations or transformation of physical quantities or representations of physical quantities as modules or code devices, without loss of generality.

However, all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or "determining" or the like, refer to the action and processes of a computer system, or similar electronic computing device (such as a specific computing machine), that manipulates and transforms data represented as physical (electronic) quantities within the computer system memories or registers or other such information storage, transmission or display devices.

Certain aspects of the embodiments described herein include process steps and instructions described herein in the form of an algorithm. It should be noted that the process steps and instructions of the embodiments could be embodied in software, firmware or hardware, and when embodied in software, could be downloaded to reside on and be operated from different platforms used by a variety of operating systems. The embodiments can also be in a computer program product which can be executed on a computing system.

The embodiments also relates to an apparatus for performing the operations herein. This apparatus can be specially constructed for the purposes, e.g., a specific computer, or it can comprise a general-purpose computer selectively activated or reconfigured by a computer program stored in the computer. Such a computer program can be stored in a non-transitory computer readable storage medium, such as, but is not limited to, any type of disk including floppy disks, optical disks, CD-ROMs, magnetic-optical disks, read-only memories (ROMs), random access memories (RAMs), EPROMs, EEPROMs, magnetic or optical cards, application specific integrated circuits (ASICs), or any type of media suitable for storing electronic instructions, and each electrically connected to a computer system bus. Furthermore, the computers referred to in the specification can include a single processor or can be architectures employing multiple processor designs for increased computing capability.

The algorithms and displays presented herein are not inherently related to any particular computer or other apparatus. Various general-purpose systems can also be used with programs in accordance with the teachings herein, or it can prove convenient to construct more specialized apparatus to perform the method steps. The structure for a variety of these systems will appear from the description below. In addition, the embodiments are not described with reference to any particular programming language. It will be appreciated that a variety of programming languages can be used to implement the teachings of the embodiments as described herein, and any references below to specific languages are provided for disclosure of enablement and best mode of the embodiments.

In addition, the language used in the specification has been principally selected for readability and instructional purposes, and may not have been selected to delineate or circumscribe the inventive subject matter. Accordingly, the disclosure of the embodiments is intended to be illustrative, but not limiting, of the scope of the embodiments, which is set forth in the claims.

As was stated above, there are many applications within the radio communications industry, where it is desired to measure the RF power that is present within a transmission line structure. While there have been many approaches to this requirement used throughout the years, the ability to perform these measurements at low cost while maintaining high performance has always been a challenge. Further, RF power sensors using a directional coupler are large, which is inconvenient in most cabinets and racks, where space is at a premium.

Traditionally, RF power sensors have been designed and configured to use directional couplers. The coupler provides a sample of the transmission line energy, which is then processed using a detector of some type in order to convert the sampled radio frequency (RF) energy into a measurable DC voltage. Further, the directional couplers that form the heart of traditional RF power sensors achieve directionality through the sampling of both the voltage and the current waveforms (derived from the electric and magnetic fields) within the transmission line. While this approach works well in cases where it is necessary to discern between the forward and reflected traveling waveforms within the transmission line, in many cases this capability is unnecessary to the RF power sensor.

Figure 2:
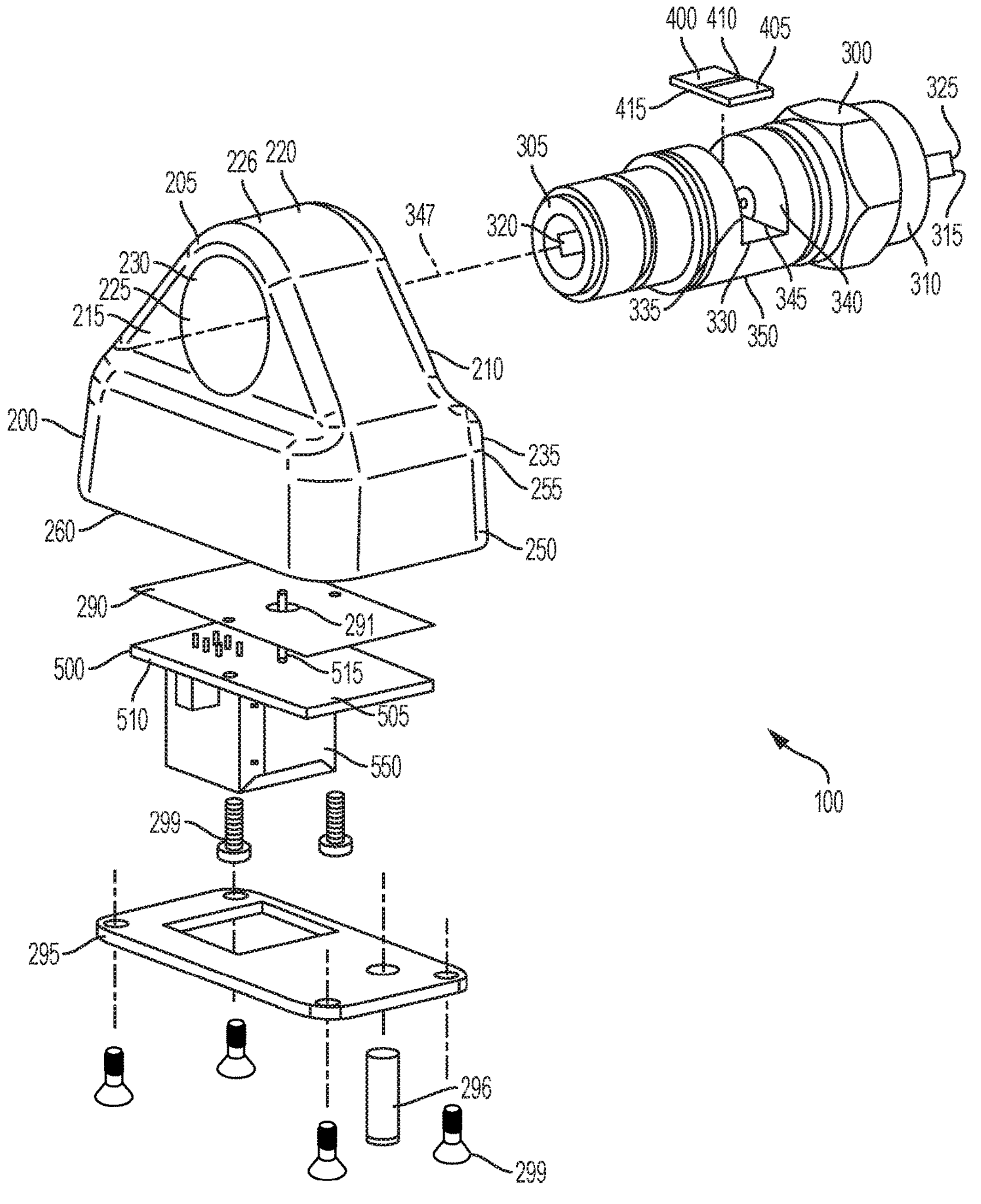
FIG. 2 is an exploded view of the RF power sensor having a non-directional coupler in accordance with an exemplary embodiment of the invention.
Figure 3:
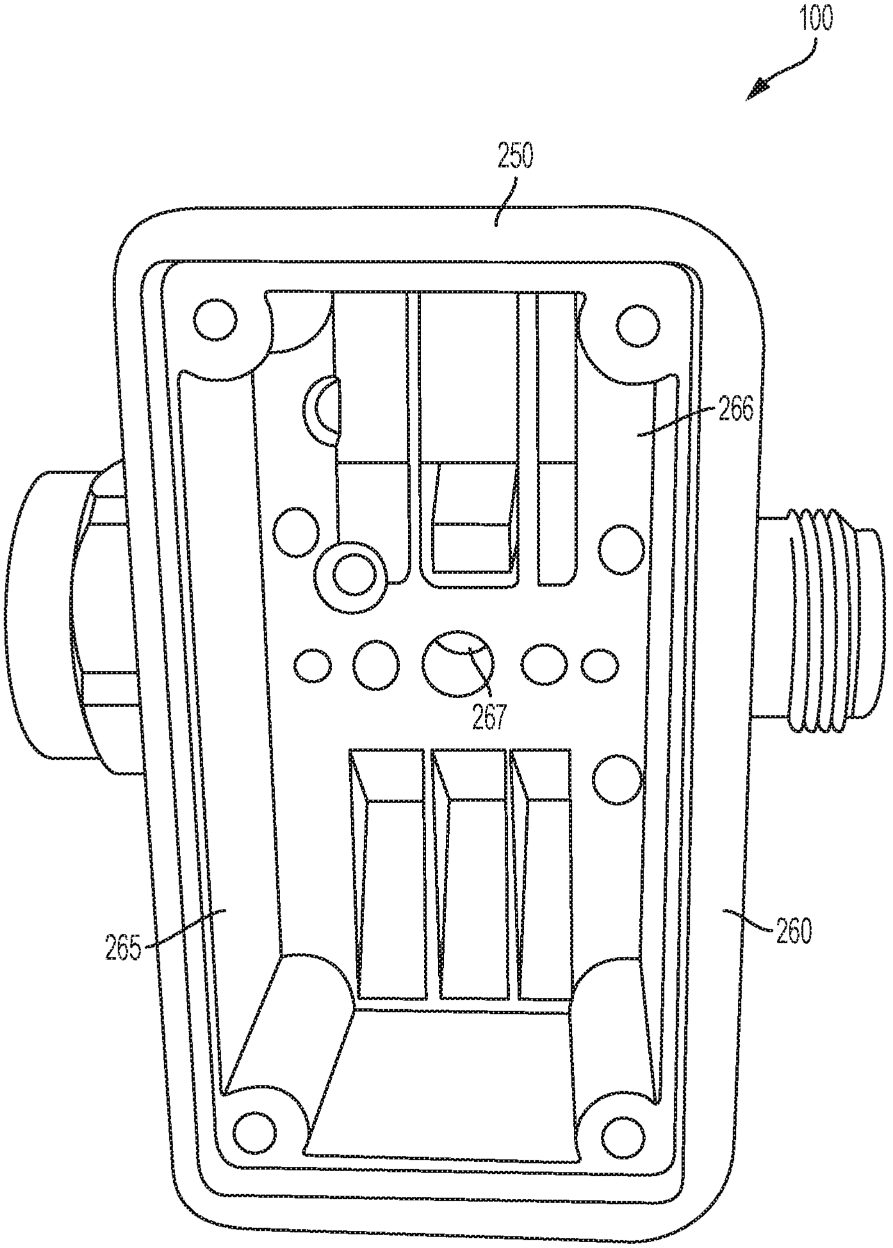
FIG. 3 is a top view of the RF power sensor having a non-directional coupler in accordance with an exemplary embodiment of the invention.
Figure 4:
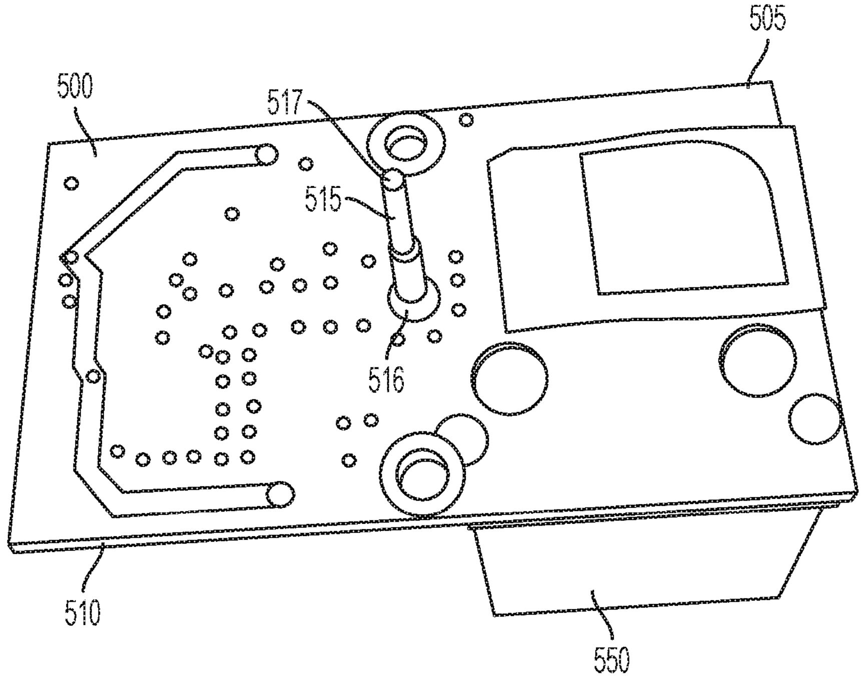
FIG. 4 is an isometric view of an analog board of the RF power sensor having a non-directional coupler in accordance with an exemplary embodiment of the invention.
Figure 5:
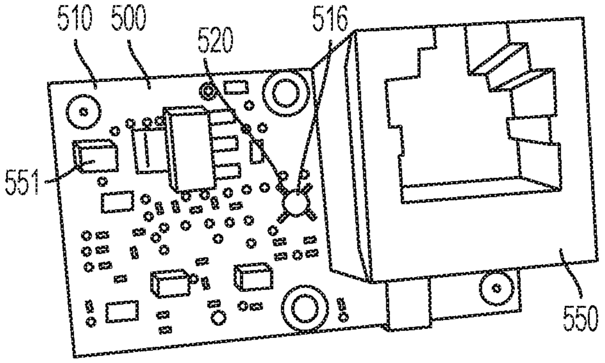
FIG. 5 is an isometric view of the analog board of the RF power sensor having a non-directional coupler in accordance with an exemplary embodiment of the invention.
Figure 6:
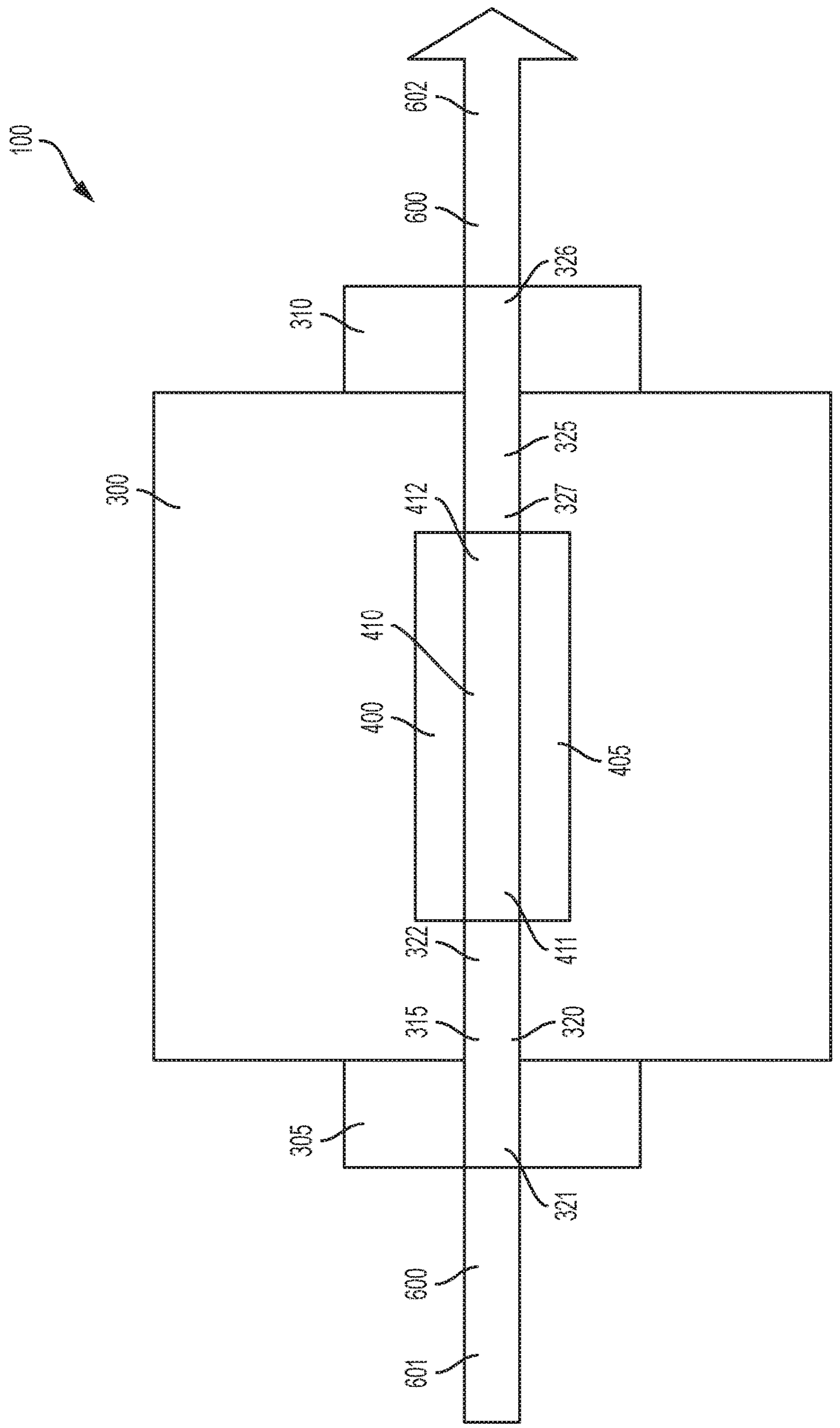
FIG. 6 is a block diagram of the RF power sensor having a non-directional coupler in accordance with an exemplary embodiment of the invention.
Figure 7:
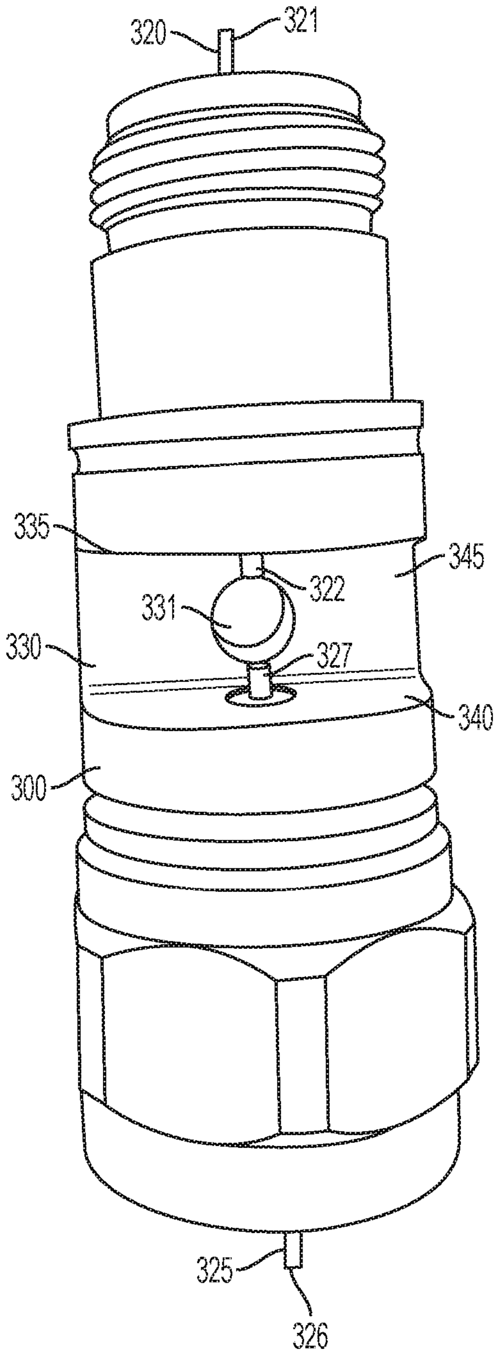
FIG. 7 is a top view of a transmission line portion of the RF power sensor having a non-directional coupler in accordance with an exemplary embodiment of the invention.
Figure 8:
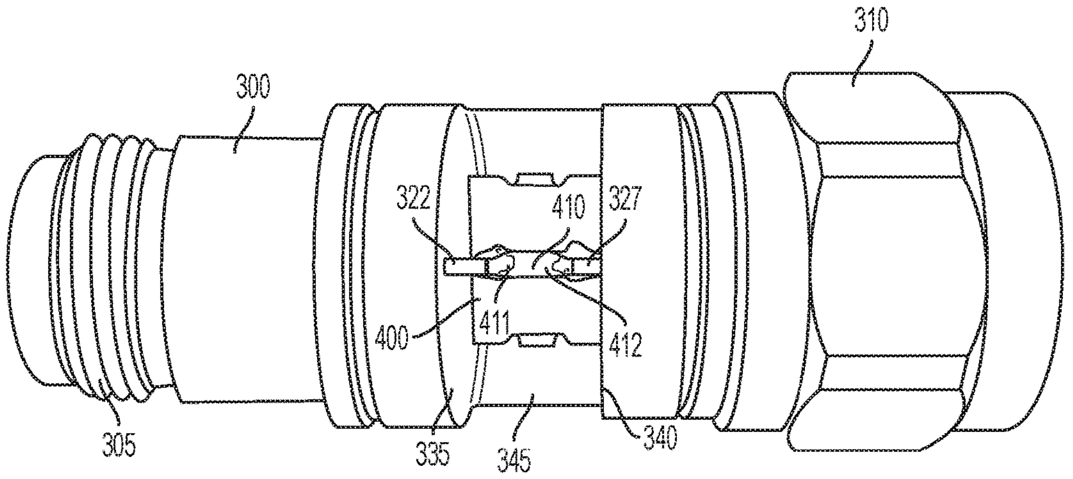
FIG. 8 is a top view of the transmission line portion of the RF power sensor having a non-directional coupler in accordance with an exemplary embodiment of the invention.
Figure 9:
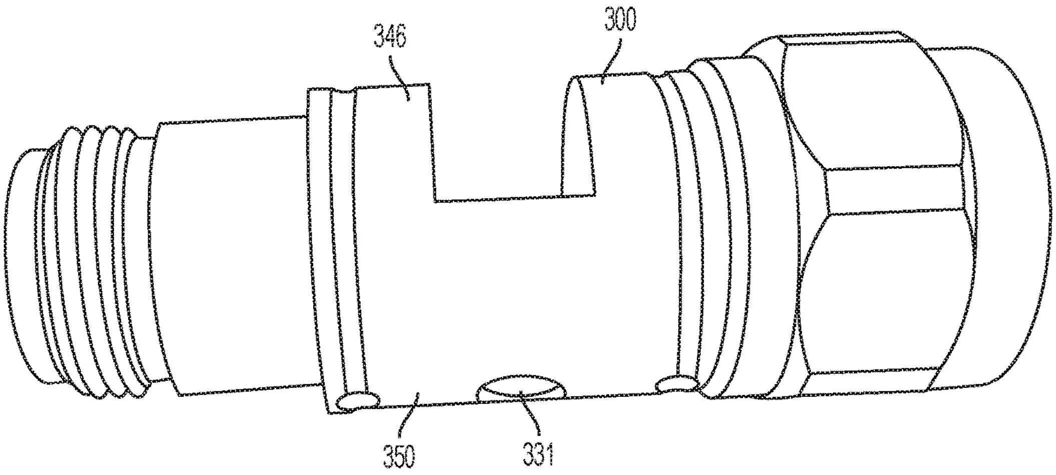
FIG. 9 is a side view of the transmission line portion of the RF power sensor having a non-directional coupler in accordance with an exemplary embodiment of the invention.

An alternative approach to the use of directional couplers, is shown in the RF power sensor 100 of FIG. 1 and FIG. 2, which uses a non-directional coupler 700 to obtain a sample of the energy on main transmission line (RF voltage) based upon only the contribution of the electric field within the transmission line structure. The use of non-directional coupler 700 greatly simplifies the configuration of RF power sensor 100. Due to the fact that RF power sensor 100 measures RF power in the main transmission line 600 based only on the electric field within main transmission line 600, the accuracy of RF power sensor 100 increases when placed at a point within the transmission system where the VSWR is low (small impedance mismatch), such as in close proximity to a an isolator on a combiner.

However, sampling only the electric field of main transmission line 600 allows for the use of fewer frequency-selective components, such as those necessary for sampling the magnetic field in a directional sensor. Therefore, RF power sensor 100 having a non-directional coupler 700 has a broader frequency response, when compared to traditional RF power sensors that use directional couplers.

Further, non-directional coupler 700 of RF power sensor 100 is a capacitive non-directional coupler. Non-directional coupler 700 uses a capacitive printed circuit board (PCB), non-directional coupler PCB 400, to sample RF energy from main transmission line 600. The configuration of non-directional coupler PCB 400 in RF power sensor 100 is fixed once produced and thereby requires no adjustment, which simplifies assembly and calibration, when compared to directional couplers. This is due to the fact that a directional coupler involves the calibration of two independent measurement channels, and each directional coupler channel depends upon the sampling of both electric and magnetic fields, the calibration and testing of directional coupler based systems is necessarily more complicated. In addition, the property that quantifies the directional performance of the coupler (directivity) must also be tested. Further, since the configuration of non-directional coupler PCB 400 of RF power sensor is fixed upon assembly, RF power sensor 100 does not have to be recalibrated after production, which is in contrast to RF power sensors that use directional couplers and must be calibrated at regular intervals.

Further, it has traditionally been prohibitively expensive to deploy several traditional RF power sensors with directional couplers in RF systems, and is becoming even more expensive as the number of systems increase and become larger and more complex. Due to the design of non-directional coupler 700 of RF power sensor 100 of FIG. 1, the cost per unit of RF power sensor 100 is a fraction of the cost of traditional RF power sensors that utilize directional couplers. This permits RF system owners to deploy a large number of RF power sensors 100 with non-directional couplers 700 for the same price as a few traditional RF power sensors that utilize directional couplers. This allows system owners to better manage and obtain more information about their RF systems. One example is the ability to install an RF power sensor 100 on the transmission line of each individual channel entering a combiner. This provides a system owner a cost effective avenue for obtaining an individual measurement of the level of RF power each channel is sending to the combiner. This has been a long-felt need that was previously cost prohibitive for system owners to implement using traditional RF power sensors with directional couplers. The RF power sensor 100 with non-directional coupler 700 is able to meet this long felt need in the industry.

Turning to FIGS. 1-11, RF power sensor 100 has a carrier body 105. Carrier body 105 has a main body 200 and a transmission line portion 300. In one exemplary embodiment, main body 200 is plastic and transmission line portion 300 is metal. Main body 200 has a wedge portion 205 and a cuboid portion 250. The apex 220 of wedge portion 205 is chamfered. Wedge portion 205 also includes an upstream wall 215 and a downstream wall 210 opposite of upstream wall 215. An outer wall 226 spans between upstream wall 215 and downstream wall 210. Wedge portion 205 includes a cylindrical aperture 225 that extends through upstream wall 215 and downstream wall 210. The cylindrical aperture 225 is oriented to be concentric with transmission line portion 300, which permits wedge portion 205 of main body 200 to be placed around a section of transmission line portion 300, thereby forming carrier body 105.

Cylindrical aperture 225 of wedge portion 205 has an inner surface 230 with a metal coating. The metal coating on inner surface 230 of cylindrical aperture 225 works in conjunction with the metal construction material of transmission line portion 300 to form a Faraday cage around RF power sensor transmission line 315. More specifically, when the cylindrical aperture 225 of wedge portion 205 is placed over groove 345 of transmission line portion 300 containing non-directional coupler PCB 400, the metal coating on inner surface 230 of cylindrical aperture 225 works in conjunction with the metal construction material of transmission line portion 300 to form a shield around RF power sensor transmission line 315.

Wedge portion 205 has a base 235 that is fixed to a first side 255 of cuboid portion 250 of main body 200. A cover 295 is placed over a cavity 265 formed in the second side 260 of cuboid portion 250. First side 255 of cuboid portion 250 being opposite of second side 260. Cover 295 has a port aperture 298 through which port 550 extends. Cover 295 also has a light tube aperture 297 through which light tube 296 extends, thereby permitting a user to see the light produced by LED 551.

Cuboid portion 250 contains analog board 500 having a first side 505 and a second side 510, with the first side 505 being opposite of the second side 510. A first side 505 of analog board 500 is oriented toward a base 266 of cavity 265 of cuboid portion 250. The analog board 500 has a power transmission member 515 having a distal end 517 that projects away from the first side 505 of analog board 500 toward base 266 of cuboid portion. The distal end 517 of power transmission member 515 is electrically connectable to the printed metallic structure 420 on the reverse side 415 of non-directional coupler PCB 400. A capacitive attenuator 520 is located at the base 516 of power transmission member 515. In some exemplary embodiments, capacitive attenuator 520 is a distributed capacitor array mounted on a second side 510 of analog board, and located around base 516 of power transmission member 515 on a second side 510 of analog board 500. In some exemplary embodiments, the base 516 of power transmission member 515 extends from the first side 505 of analog board 500 to a second side 510 of analog board 500.

Power transmission member 515 is flexible. In some exemplary embodiments, power transmission member 515 can be a wire. In other exemplary embodiments, power transmission member 515 can be a telescoping pin. In additional exemplary embodiments, power transmission member 515 can be a spring loaded telescoping pin.

An insulation layer 290 is located between analog board 500 and base 266 of cavity 265 of cuboid portion. Cuboid portion cavity base 266 has an aperture 267 and insulation layer 290 has an aperture 291. Cuboid base cavity aperture 267 and insulation layer aperture 291 are concentric, thereby allowing power transmission member 515 to pass through.

Analog board 500 is secured to cuboid portion 250 and transmission line portion 300 of RF power sensor 100 using fasteners 299. Additionally, insulation layer 290 is secured to cuboid portion 250 and transmission line portion 300 of RF power sensor 100 using fasteners 299. Further cuboid portion 250 is also secured to transmission line portion 300 using fasteners 299. Further, cover 295 is fastened to the second side 260 of cuboid portion 250 using fasteners 299.

Second side 510 of analog board 500 also has a port 550 and an LED 551. LED 551 provides an indication of power status and is visible to a user through light tube 296.

Transmission line portion 300 has an upstream connector 305 and a downstream connector 310 for connecting transmission line portion 300 of RF power sensor 100 to main transmission line 600, thereby electrically connecting RF power sensor transmission line 315 to main transmission line 600. Transmission line portion 300 has a groove 345 that is oriented perpendicular to a longitudinal axis 347 of transmission line portion 300. The groove 345 is located about midway between upstream connector 305 and downstream connector 310. The groove 345 commences slightly below the longitudinal axis 347 of transmission line portion 300, and runs through the top 346 of the transmission line portion 300. Groove 345 is Quonset-shaped, having a semi-circular cross section, and formed by an upstream wall 335, downstream wall 340, and base wall 330 of transmission line portion 300. Non-directional coupler printed circuit board (PCB) 400 is located in groove 345. Non-directional coupler PCB 400 is oriented in groove 345, such that a reverse side 415 of non-directional coupler PCB 400 faces base wall 330 of transmission line portion 300.

Transmission line portion 300 of RF power sensor 100 has an RF power sensor transmission line 315 running through transmission line portion 300. RF power sensor transmission line 315 has an upstream section 320, a coupler section 410, and a downstream section 325. The upstream section 320 has a first end 321 and a second end 322. The first end 321 of upstream section 320 is electrically and mechanically connectable to upstream end 601 of main transmission line 600 through upstream connector 305 of transmission line portion 300. In one exemplary embodiment, upstream connector 305 is a Type N male connector.

The second end 322 of upstream section 320 is electrically connected to upstream end 411 of coupler section 410 of non-directional coupler PCB 400. In one exemplary embodiment, upstream end 411 of coupler section 410 is soldered to a portion of the second end 322 of upstream section 320 that extends through upstream wall 335. The soldering of upstream end 411 to second end 322 mechanically secures non-directional coupler PCB 400 in place within the groove 345 of transmission line portion 300.

The downstream section 325 of RF power sensor transmission line 315 has a first end 326 and a second end 327. The second end 327 of downstream section 325 is electrically connected to a downstream end 412 of coupler section 410 of non-directional coupler PCB 400. In one exemplary embodiment, downstream end 412 of coupler section 410 is soldered to a portion of the second end 327 of the downstream section 325 that extends through downstream wall 340. The soldering of downstream end 412 to second end 327 mechanically secures non-directional coupler PCB 400 in place within the groove 345 of transmission line portion 300.

The first end 326 of downstream section 325 of RF power sensor transmission line 315 is electrically and mechanically connectable to downstream end 602 of main transmission line 600 through downstream connector 310. In one exemplary embodiment, downstream connector 310 is a Type N female connector.

Figure 10:
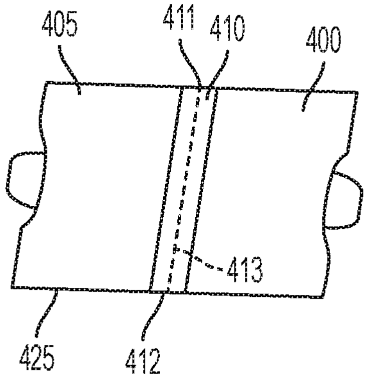
FIG. 10 is an isometric view of a non-directional coupler printed circuit board of the RF power sensor having a non-directional coupler in accordance with an exemplary embodiment of the invention.
Figure 11:
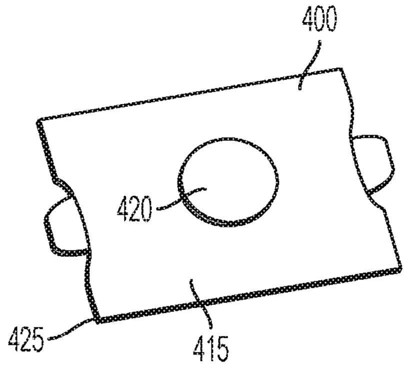
FIG. 11 is an isometric view of the non-directional coupler printed circuit board of the RF power sensor having a non-directional coupler in accordance with an exemplary embodiment of the invention.

FIGS. 10 and 11 show an isometric view of non-directional coupler PCB 400 of RF power sensor 100. Non-directional coupler PCB 400 has a front side 405 and a reverse side 415. Front side 405 and reverse side 415 are located on opposite sides of non-directional coupler PCB 400. The front side 405 includes coupler section 410 of RF power sensor transmission line 315. In one exemplary embodiment coupler section 410 is a 50 ohm printed microstripline transmission line which has been optimized for low insertion loss and good insertion VSWR at frequencies up to about 2 GHz. For example, in an exemplary embodiment the insertion off of coupler section 410 is less than about 0.1 dB and the VSWR is about 1.10.

Non-directional coupler PCB 400 has a reverse side 415 with a printed metallic structure 420. In one exemplary embodiment, the printed metallic structure 420 is a printed metallic circular dot having a diameter of about 0.125 inches. It is contemplated that printed metallic structure can be another shape, such as, but not limited to, an oval or rectangle. In an exemplary embodiment, the center of printed metallic structure 420 is located along the centerline 413 of coupler section 410. Further, in some exemplary embodiments, the center of printed metallic structure 420 is located along the centerline 413 of coupler section 410, and also located midway between the upstream end 411 and downstream end 412 of coupler section 410.

The amount of overlap of coupler section 410 and printed metallic structure 420 is a factor that determines the value of the capacitor formed by the di-electric material 425, coupler section 410, and printed metallic structure of non-directional coupler PCB 400. Other factors that can affect the value of the capacitance include the width of coupler section 410, the thickness of the di-electric material 425 of non-directional coupler PCB 400, and the size of printed metallic structure 420 (e.g. diameter of the circle).

Non-directional coupler PCB 400 has a di-electric material 425 located between the coupler section 410 and printed metallic structure 420. In one exemplary embodiment of non-directional coupler PCB 400, the di-electric material 425 is FR4. The thickness of the FR4 is about 0.020 inches, and the thickness of the copper foil, of which the coupler section 410 and printed metallic structure 420 are made, is about at least 0.008 inches. The length of non-directional coupler PCB 400 is about 0.3 inches, and the width is about 0.4 inches. It is contemplated that non-directional coupler PCB 400 could be made of another di-electric material 425, such as, but not limited to, printed circuit board materials offered by Arlon or Rodgers 58-80, that are capable of having dielectric properties similar to that of the di-electric material 425 non-directional coupler PCB 400 sized as described above and manufactured from FR4. FR4 is a composite di-electric material composed of woven fiberglass cloth with an epoxy resin binder that is flame resistant (self-extinguishing).

Turning to FIGS. 2-4, 7, 9, and 11, base wall 330 of transmission line portion 300 has an aperture 331 and base 350 of transmission line portion 300 has an aperture 331. Further, as was discussed above, cuboid portion cavity base 266 has an aperture 267 and insulation layer 290 has an aperture 291. All of these apertures are concentric, thereby permitting a distal end 517 power transmission member 515 to pass through and contact printed metallic structure 420 on the reverse side 415 of non-directional coupler PCB 400. Power transmission member 515 is electrically connectable to printed metallic structure 420. Power transmission member 515 provides a pathway for the RF power sampled from main transmission line 600 by non-directional coupler PCB 400 to travel to analog board 500.

Figure 12:
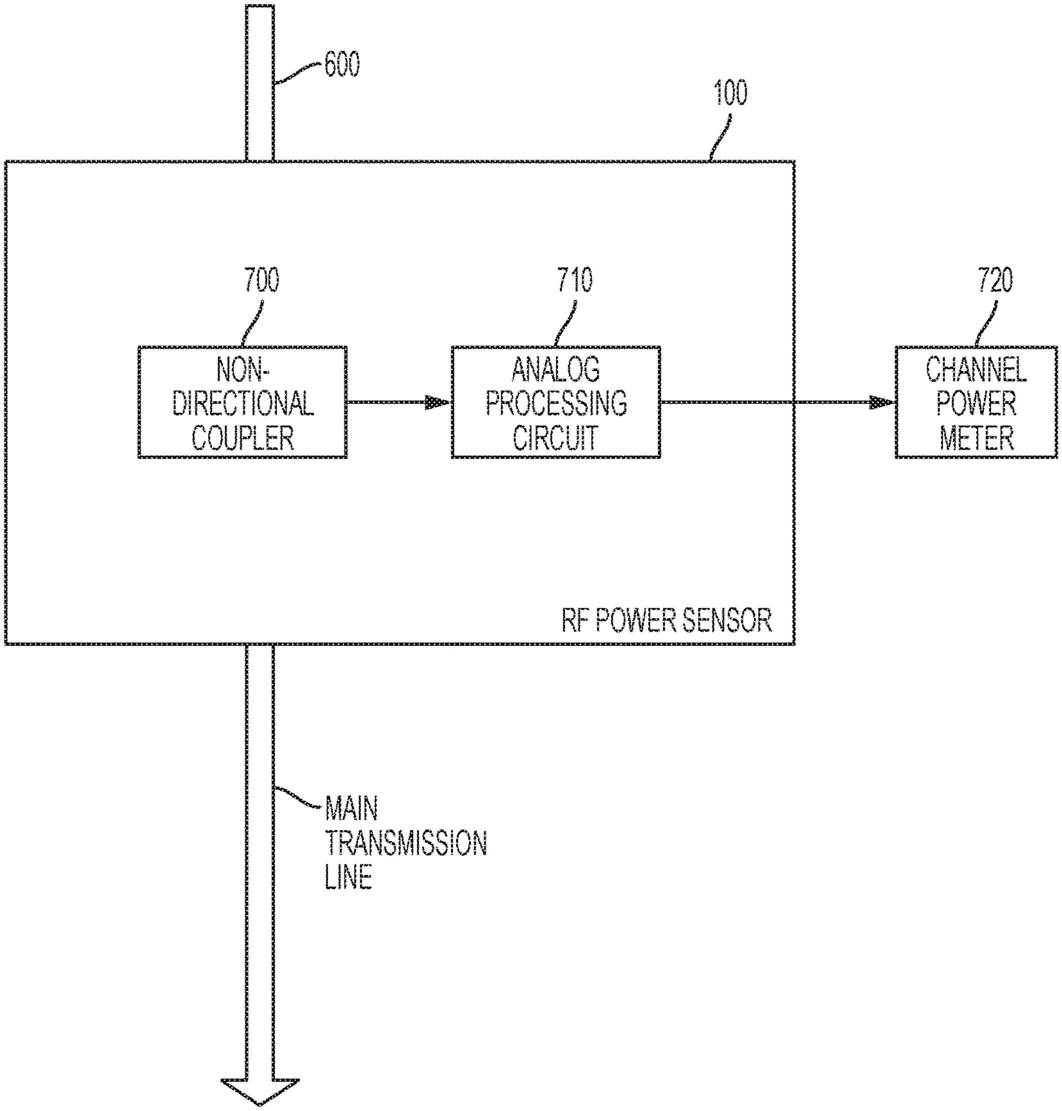
FIG. 12 is a block diagram of the RF power sensor having a non-directional coupler in accordance with an exemplary embodiment of the invention.

FIG. 12 shows a block diagram of RF power sensor 100. RF power sensor 100 is comprised of a non-directional coupler 700 and an analog processing circuit 710. Main transmission line 600 is electrically connected to non-directional coupler 700. Non-directional coupler 700 is electrically connected to analog processing circuit 710. Analog processing circuit 710 is electrically connected to channel power meter 720. Main transmission line 600 is electrically connected to RF power sensor 100. RF power sensor 100 is electrically connected to channel power meter. The non-directional coupler 700 samples the energy on main transmission line 600 (RF voltage) and provides the sample of energy to analog processing circuit 710. Analog processing circuit 710 receives the sample of energy from non-directional coupler 700, processes the sample of energy, and outputs a DC voltage that is scaled to represent the full scale level of RF power travelling on main transmission line 600. Analog processing circuit 710 outputs the DC voltage to channel power meter 720. Stated alternatively, analog processing circuit 710 turns the sampled energy into a scaled DC voltage that is linearly proportional to the RF power on the main transmission line 600. Channel power meter 720 is configured to display the value for the full scale level of RF power travelling on main transmission line 600, which corresponds to the value of the scaled DC voltage received from the analog processing circuit 710.

For example, if the RF power sensor 100 has a full scale power range of 100 and has a scaled analog DC output range of 0-4 VDC, the analog processing circuitry would output a scaled DC voltage level of 2 VDC to channel power meter 720, when 50 W is travelling on main transmission line 600. Channel power meter 720, being configured with a scaled DC input range of 0-4 VDC, would receive the 2 VDC scaled DC voltage and display a power measurement of 50 W on the main transmission line 600. It is contemplated that the scaled DC voltage output of analog processing circuit 710 of RF power sensor 100 and the analog DC input of channel power meter 720 can be scaled to a range other than 0-4 VDC.

Figure 13:
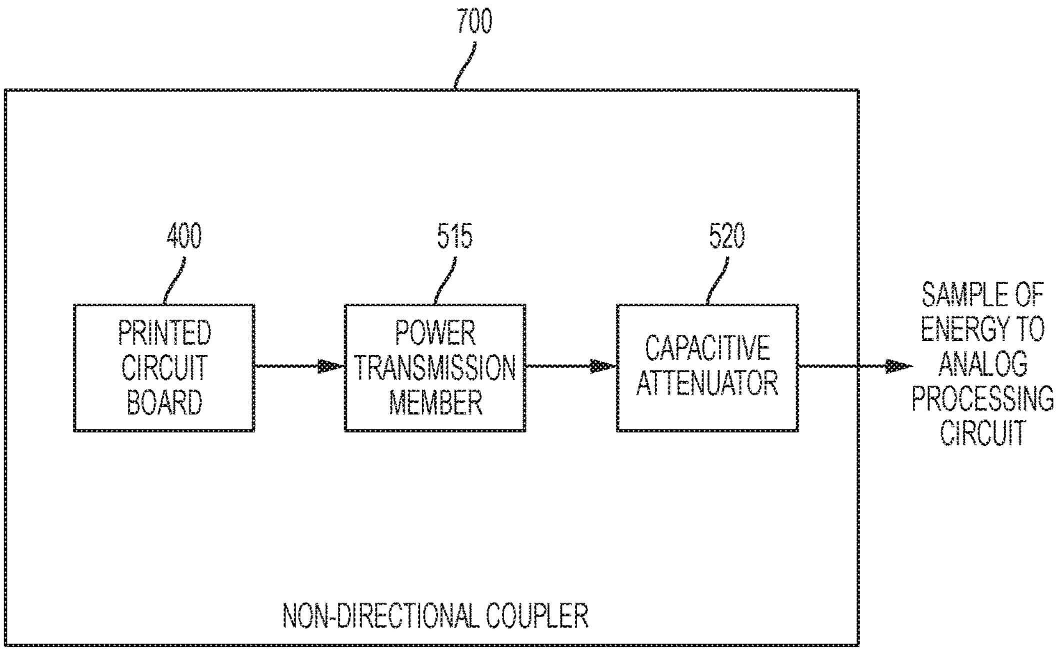
FIG. 13 is a block diagram of a non-directional coupler of the RF power sensor having a non-directional coupler in accordance with an exemplary embodiment of the invention.
Figure 14:
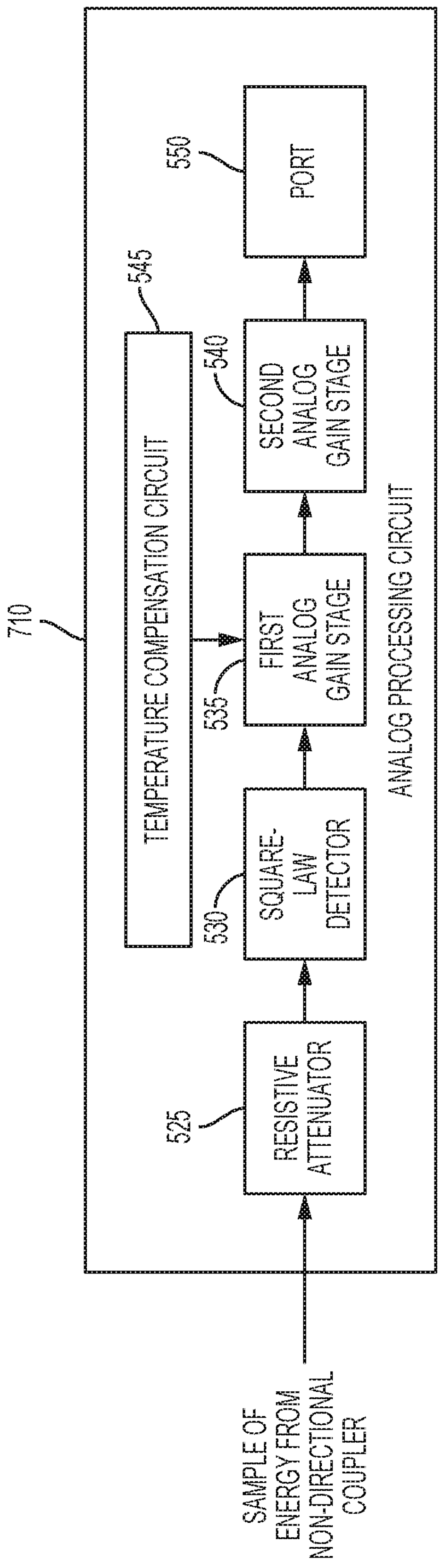
FIG. 14 is a block diagram of an analog processing circuit of the RF power sensor having a non-directional coupler in accordance with an exemplary embodiment of the invention.

Turning to FIGS. 13-14, FIG. 13 shows a block diagram of non-directional coupler 700, which includes non-directional coupler PCB 400, power transmission member 515, and capacitive attenuator 520. Non-directional coupler PCB 400 is electrically connected to power transmission member 515. Power transmission member 515 is electrically connected to capacitive attenuator 520, which is configured as a shunt capacitor. Capacitive attenuator 520 is electrically connected to analog processing circuit 710. As was stated above, non-directional coupler 700 obtains a sample of the energy on main transmission line 600 (RF voltage) and provides the sampled energy from main transmission line 600 to analog processing circuit 710. Turning to FIGS. 6, 10-11 and 13, coupler section 410 of non-directional coupler PCB 400, part of RF power sensor transmission line 315, is electrically connectable to main transmission line 600. When coupler section 410 is electrically connected to the main transmission line 600, the energy flowing between the upstream end 601 and downstream end 602 of main transmission line 600 passes through coupler section 410 of non-directional coupler PCB 400. As was stated above, non-directional coupler PCB 400 acts as a capacitor, due to the configuration of the printed metallic structure 420, coupler section 410, and the di-electric material 425 of non-directional coupler PCB 400. Accordingly, non-directional coupler 700 acts as a capacitive non-directional coupler. Further, coupler section 410 and printed metallic structure 420 are configured to couple when said RF power is present on said coupler section Accordingly, when energy (RF power) is travelling through main transmission line 600, a capacitive voltage divider is formed by non-directional coupler PCB 400 and capacitive attenuator 520, which are electrically connected through power transmission member 515. Stated alternatively, non-directional coupler PCB 400 and capacitive attenuator 520 of non-directional coupler 700 are configured to form a capacitive voltage divider that produces a sample of the energy traveling on main transmission line 600. The sampled energy produced by non-directional coupler 700 is provided to analog processing circuit 710.

In one exemplary embodiment, the power level of the energy sample produced by non-directional coupler 700 is approximately 14 dBm at full scale thru line power. Further, in one exemplary embodiment, the power level of the energy sample produced by non-directional coupler 700 is approximately −36 dBm from the main transmission line 600 at full scale thru line power.

FIG. 14 shows a block diagram of an analog processing circuit 710 of RF power sensor 100, which has a resistive attenuator 525, a square-law detector 530, a first analog gain stage 535, a second analog gain stage 540, a temperature compensation circuit 545, and a port 550. Analog processing circuit 710 is electrically connected to and receives the energy sample produced by non-directional coupler 700. More specifically, resistive attenuator 525 is electrically connected to and receives the sample of energy travelling on main transmission line 600 from non-directional coupler 700. Resistive attenuator 525 is electrically connected to square-law detector 530. Square-law detector 530 is electrically connected to first analog gain stage 535. First analog gain stage 535 is electrically connected to second analog gain stage 540. Second analog gain stage 540 is electrically connected to port 550. Temperature compensation circuit 545 is electrically connected to first analog gain stage 535. Port 550 is electrically connectable to channel power meter 720. Analog processing circuit 710 of RF power sensor 100 is electrically connectable to channel power meter 720.

Resistive attenuator 525 receives the sample of the energy on main transmission line 600 from and produced by non-directional coupler 700. Resistive attenuator 525 attenuates the sample of energy (RF voltage) received from the non-directional coupler 700 by setting the voltage level of the sample of energy to a level appropriate for the square-law detector 530. Resistive attenuator 525 also provides isolation between the circuit components of the non-directional coupler 700 and the circuit components of the analog processing circuit 710. Resistive attenuator 525 outputs the attenuated sample of energy to square-law detector 530.

Accordingly, resistive attenuator 525 is configured to receive the sample of energy (RF voltage) representative of the energy travelling on main transmission line 600 from non-directional coupler 700, and convert the sample of energy to an attenuated sample of energy (RF voltage) representative of the energy travelling on main transmission line 600. In one exemplary embodiment, the attenuated sample of energy outputted by the resistive attenuator 525 to square-law detector 530 is approximately −23 dBm from the main transmission line 600 at full scale thru line power, which allows square-law detector 530 to operate within the square-law region of its dynamic response.

Square-law detector 530 receives the attenuated sample of energy (RF voltage) produced by resistive attenuator 525 and outputs to first analog gain stage 535 an analog DC voltage representative of the energy travelling on main transmission line 600. Accordingly, square-law detector 530 is configured to receive the attenuated sample of energy (RF voltage) representative of the energy travelling on main transmission line 600, convert the sample of energy to an analog DC voltage representative of the energy travelling on main transmission line 600, and provide the analog DC voltage to first analog gain stage 535. In one exemplary embodiment, the analog DC voltage output of square-law detector 530 is about 1 mV at full scale.

First analog gain stage 535 receives the analog DC voltage output from square-law detector 530 and applies a temperature correction to the analog DC voltage output from square-law detector 530. The temperature correction applied by first analog gain stage 535 compensates for the effect of any thermally induced drift of square-law detector 530. This temperature corrected DC voltage is provided to second analog gain stage 540. The amount of temperature correction applied by first analog gain stage 535 is determined by the output of temperature compensation circuit 545. Temperature compensation circuit 545 measures the temperature of the air in the cavity 265 of cuboid portion 250. In one exemplary embodiment, temperature compensation circuit 545 is a position placed in the feedback loop of first analog gain stage 535. It is contemplated that in other exemplary embodiments, temperature compensation circuit 545 could be implemented using other devices, such as, but not limited to, a thermistor.

First analog gain stage 535 also applies some amplification to the analog DC voltage prior to output as the temperature corrected DC voltage to second analog gain stage 540. The overall gain of first analog gain stage 535 will also vary and be determined by temperature compensation circuit 545. In one exemplary embodiment, a gain of about 824 is applied to the analog DC voltage by first analog gain stage 535, thereby producing a temperature corrected DC voltage of about 0.8V.

Accordingly, first analog gain stage 535 is configured to receive the analog DC voltage representative of the energy travelling on main transmission line 600, apply a gain to the analog DC voltage that includes temperature correction to compensate for the effect of any thermally induced drive of square-law detector 530, and output a temperature corrected DC voltage to second analog gain stage 540 that is representative of the energy travelling on main transmission line 600. Therefore, first analog gain stage 535 is configured to receive the analog DC voltage representative of the energy travelling on main transmission line 600, produce a temperature corrected DC voltage by applying a temperature correction to said analog DC voltage, and output the temperature corrected DC voltage to second analog gain stage 540 that is representative of the energy travelling on main transmission line 600.

In one exemplary embodiment, first analog gain stage 535 is a precision operational amplifier with a very low offset, such as less than 1 μV.

Second analog gain stage 540 receives the temperature corrected DC voltage from first analog gain stage 535, and applies a gain to the temperature corrected DC voltage output from first analog gain stage 535. The gain applied by second analog gain stage 540 scales the temperature corrected DC voltage for output as a scaled DC voltage representative of the energy travelling on main transmission line 600.

Accordingly, second analog gain stage 540 is configured to receive the temperature corrected DC voltage representative of the energy travelling on main transmission line 600, scale the temperature corrected DC voltage by applying a gain to temperature corrected DC voltage, and output the scaled DC voltage to port 550 that is representative of the energy travelling on main transmission line 600.

In one exemplary embodiment, a gain of about 5 is applied to the temperature corrected DC voltage by second analog gain stage 540 to produce the scaled DC voltage, but a person having ordinary skill in the art could choose to apply another gain value in the event that a different scale is desired. In the exemplary embodiment, the RF power sensor 100 has a full scale power range of 100 W and the scaled DC voltage range is 0-4 VDC. Accordingly, in the exemplary embodiment, the scaled DC voltage output of second analog gain stage 540 to port 550 would be 0 VDC when 0 W is travelling on main transmission line 600, 2 VDC when 50 W is travelling on main transmission line 600, and 4 VDC when 100 W is travelling on main transmission line 600. It is contemplated that the scale applied to the temperature corrected DC voltage by second analog gain stage 540 to produce scaled DC voltage can be changed to have a range other than 0-4 VDC by adjusting the gain of second analog gain stage 540.

Port 550 receives the scaled DC voltage from second analog gain stage and provides the scaled DC voltage for output, such as to channel power meter 720 for the display of the full power value to a user. Accordingly, port 550 of analog processing circuit 710 of RF power sensor 100 is configured to provide the scaled DC voltage for output, such as to channel power meter 720 for the display of the full power value to a user. Further, port 550 of RF power sensor 100 is configured to provide the scaled DC voltage for output, such as to channel power meter 720 for the display of the full power value to a user.

Figure 15:
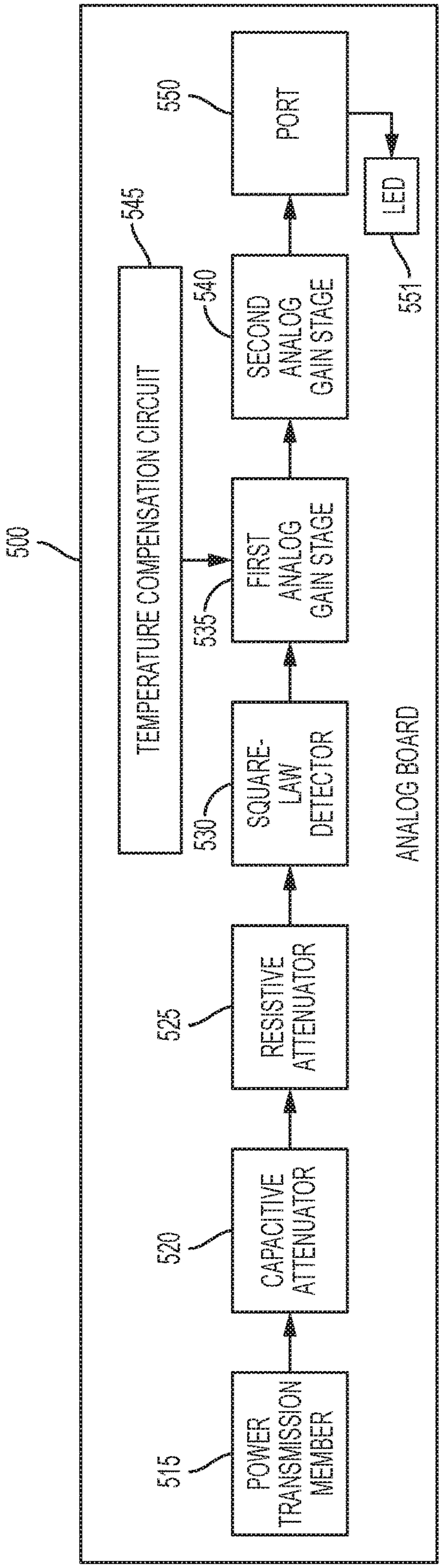
FIG. 15 is a block diagram of an analog board of the RF power sensor having a non-directional coupler in accordance with an exemplary embodiment of the invention.

FIG. 15 shows a block diagram of analog board 500 of RF power sensor 100. Analog board 500 includes power transmission member 515, capacitive attenuator 520, resistive attenuator 525, square-law detector 530, first analog gain stage 535, second analog gain stage 540, temperature compensation circuit 545, port 550, and LED 551. Power transmission member 515 is electrically connected to capacitive attenuator 520. Capacitive attenuator 520 is electrically connected to resistive attenuator 525. Resistive attenuator 525 is electrically connected to square-law detector 530. Square-law detector 530 is electrically connected to first analog gain stage 535. First analog gain stage 535 is electrically connected to temperature compensation circuit 545. First analog gain stage 535 is electrically connected to second analog gain stage 540. Second analog gain stage 540 is electrically connected to port 550. Port 550 is electrically connected to LED 551.

Port 550 is configured to receive electrical power and provide electrical power to the various components of RF power sensor 100 that require electrical power to operate, such as first analog gain stage 535, second analog gain stage 540, temperature compensation circuit 545, and LED 551. LED 551 is configured to illuminate when the circuitry of RF power sensor 100 is receiving electrical power through port 550 and providing electrical power to the various components of RF power sensor 100. In one exemplary embodiment, port 550 can receive power from channel power meter 720.

Figure 16:
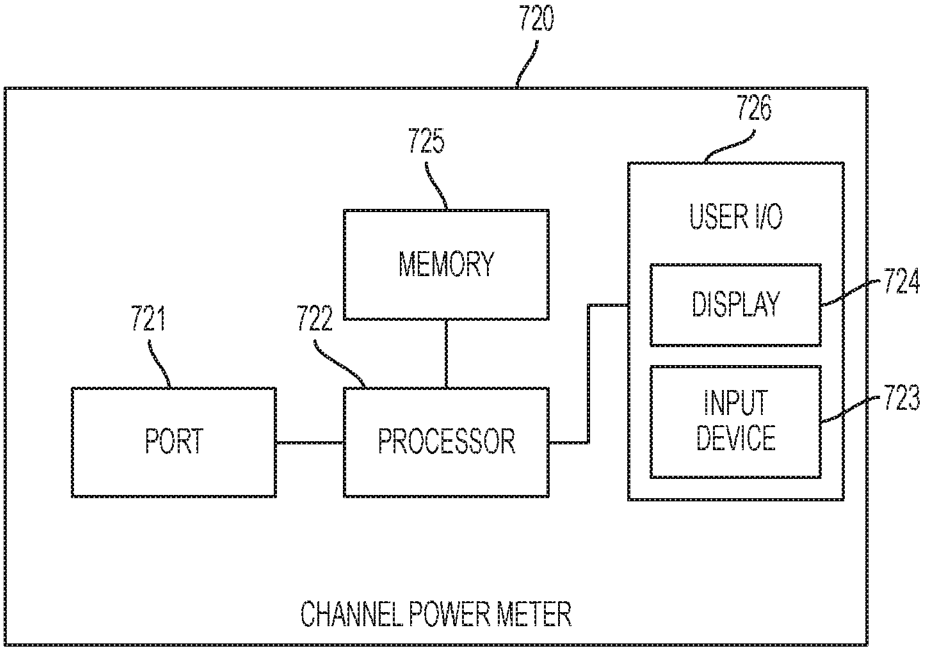
FIG. 16 is a block diagram of a channel power meter for use in an RF power metering system with the RF power sensor having a non-directional coupler in accordance with an exemplary embodiment of the invention.

FIG. 16 shows a block diagram of channel power meter 720, which includes port 721, processor 722, memory 725, and User I/O 726. User I/O 726 can include one or both of user input device 723 and display 724. In some exemplary embodiments, display 724 and user input device 723 of user I/O 726 can be combined, such as a touch screen. Further, user I/O 726 can have a separate display 724 and user input device 723. In other exemplary embodiments, user input device 723 can be buttons, a keypad or keyboard.

Processor 722 is electrically connected to port 721, display 724, memory 725, and user I/O 726. Channel power meter 720 is configured to receive a scaled DC voltage from RF power sensor 100 and display to a user, via display 724, the corresponding full scale value of RF power travelling on main transmission line 600. In the event that multiple RF power sensors 100 are connected to channel power meter 720, a user can utilize user I/O 726 to display the individual full scale values for RF power measured by each of the connected RF power sensors 100, such as by individually scrolling through and displaying one or more of the full scale values for each of the connected RF power sensors 100, or displaying all of the full scale values for each of the connected RF power sensors 100 simultaneously.

Figure 17:
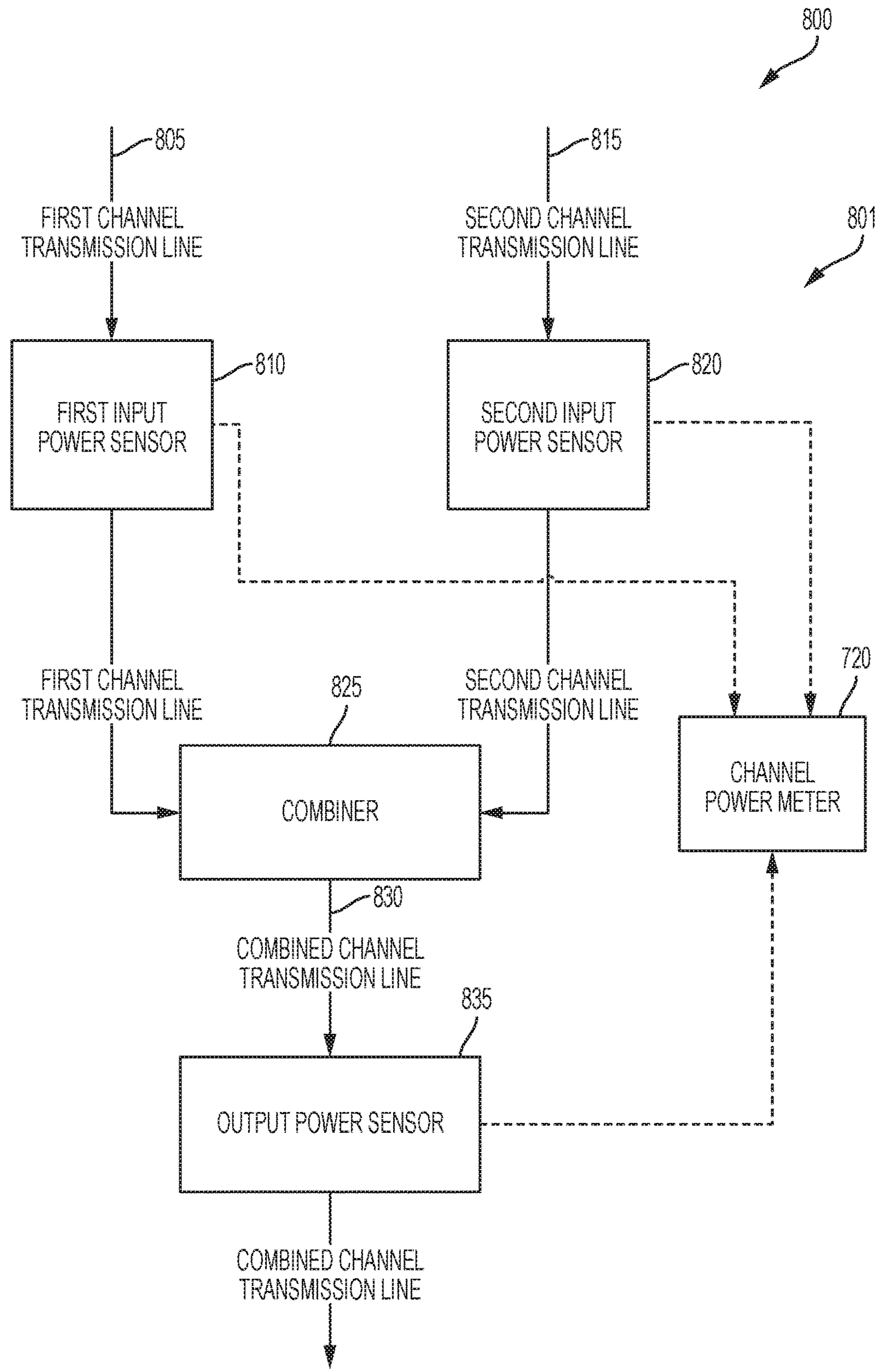
FIG. 17 is a block diagram of an RF power metering system with the RF power sensor having a non-directional coupler in accordance with an exemplary embodiment of the invention.

FIG. 17 shows a block diagram of an RF power metering system 800 for an RF transmission system 801. RF power metering system 800 has a first input power sensor 810, second input power sensor 820, and output power sensor 835. RF transmission system 801 has a first channel transmission line 805, second channel transmission line 815, combiner 825, and combined channel transmission line 830.

First input power sensor 810 is electrically connectable to first channel transmission line 805 and channel power meter 720. Second input power sensor 820 is electrically connectable to second channel transmission line 815 and channel power meter 720. Combiner 825 is electrically connected to first channel transmission line 805, second channel transmission line 815, and combined channel transmission line 830. Output power sensor 835 is electrically connectable to combined channel transmission line 830 and channel power meter 720.

First input power sensor 810 is configured to measure the RF power level on the first channel transmission line 805 and provide the measured RF power level on the first channel transmission line 805 to channel power meter 720. Second input power sensor 820 is configured to measure the RF power level on the second channel transmission line 815 and provide the measured RF power level on the second channel transmission line 815 to channel power meter 720. First input power sensor 810 can be a non-directional power sensor, such as RF power sensor 100. Second input power sensor 820 can be a non-directional power sensor, such as RF power sensor 100.

Combiner 825 is configured to combine the first channel from first channel transmission line 805 and the second channel from second channel transmission line 815 onto combined channel transmission line 830. Output power sensor 835 is configured to measure the RF power level for the first channel on the combined channel transmission line 830 and provide the measured RF power level for the first channel to channel power meter 720. Output power sensor 835 is also configured to measure the RF power level for the second channel on the combined channel transmission line 830 and provide the measured RF power level for the second channel to channel power meter 720. Output power sensor 835 can be any device that is capable of determining directional channelized power, such as a spectrum analyzer. Output power sensor 835 can also be a device that is not capable of determining directional channelized power (e.g. a composite power measurement device), as long as only the channel of interest is activated when the RF power level for the channel of interest is being measured. For example, a composite power measurement device can be used as output power sensor 835, if only the first channel is activated during the time the RF power level for the first channel is being measured, and only the second channel is activated during the time the RF power level for the second channel is being measured.

Channel power meter 720 is configured to display the RF power level for the first channel on the first channel transmission line 805, which is the RF power level for the first channel pre-combiner (RF power level for the first channel before entering combiner 825). Channel power meter 720 is also configured to display the RF power level for the second channel on the second channel transmission line 815, which is the RF power level for the second channel pre-combiner (RF power level for the second channel before entering combiner 825). Additionally, channel power meter 720 is configured to display the RF power level for the first channel on the combined channel transmission line 830, which is the RF power level for the first channel post-combiner (RF power level for the first channel after exiting combiner 825). Further, channel power meter 720 is configured to display the RF power level for the second channel on the combined channel transmission line 830, which is the RF power level for the second channel post-combiner (RF power level for the second channel after exiting combiner 825).

Also, channel power meter 720 is configured to calculate and display the combiner loss for the first channel, which is the difference between the RF power level for the first channel pre-combiner and the RF power level for the first channel post-combiner. Further, channel power meter 720 is configured to calculate and display the combiner loss for the second channel, which is the difference between the RF power level for the second channel pre-combiner and the RF power level for the second channel post-combiner.

Figure 18:
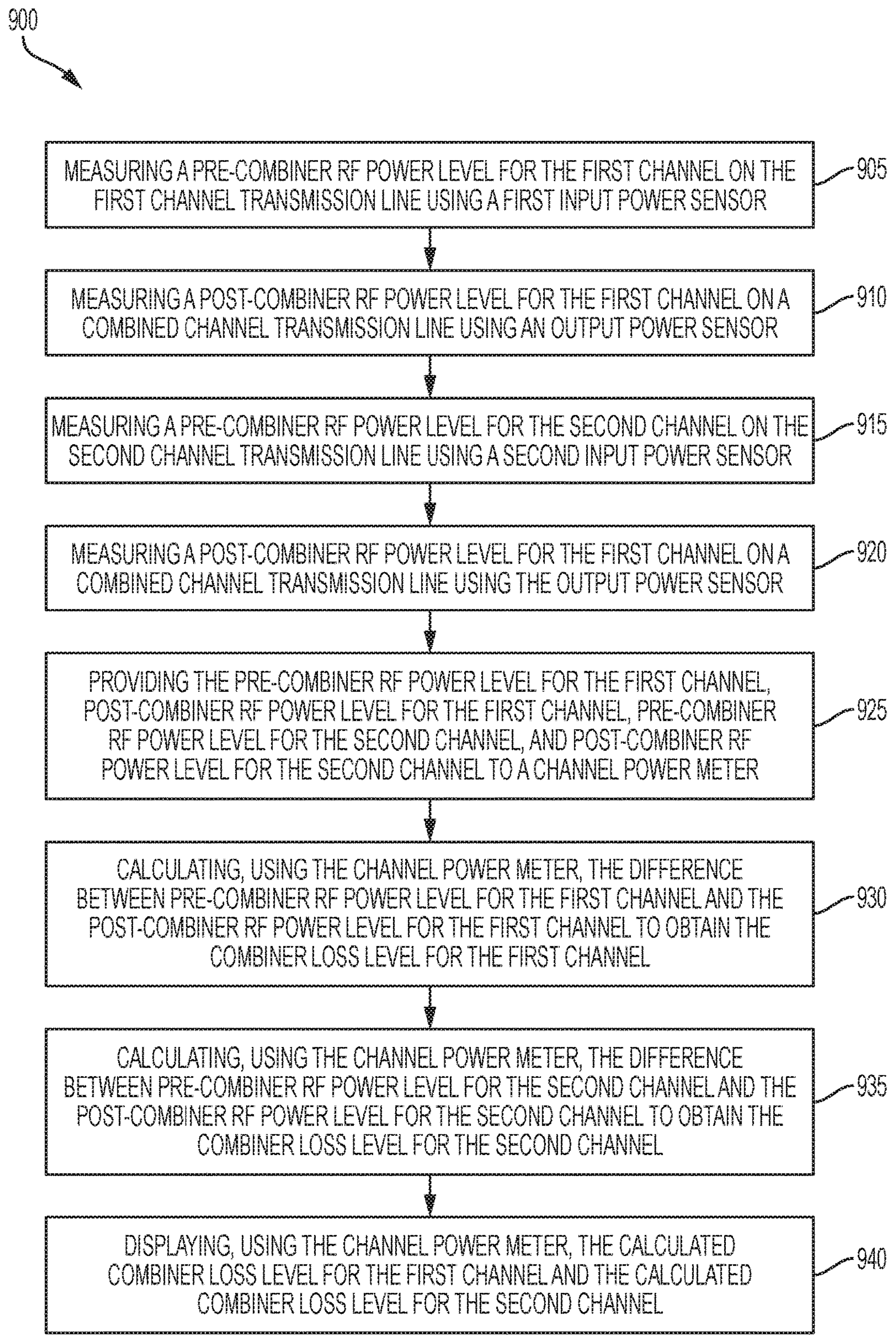
FIG. 18 is a flow chart showing a method for determining combiner loss in the RF system with the RF power sensor having a non-directional coupler in accordance with an exemplary embodiment of the invention.

FIG. 18 is a flow chart showing a method 900 for determining combiner loss in the RF transmission system 801 using RF power metering system 800. In block 905, a pre-combiner RF power level for the first channel on the first channel transmission line is measured using first input power sensor 810. First input power sensor 810 can be RF power sensor 100. In block 910, a post-combiner RF power level for the first channel on combined channel transmission line 830 is measured using output power sensor 835.

In block 915, a pre-combiner RF power level for the second channel on the second channel transmission line 815 is measured using second input power sensor 820. Second input power sensor 820 can be RF power sensor 100. In block 920, a post combiner RF power level for the second channel on combined channel transmission line 830 is measured using output power sensor 835.

In block 925, the measured pre-combiner RF power level for the first channel is provided by first input power sensor 810 to channel power meter 720, the measured post-combiner RF power level for the first channel is provided by output power sensor 835 to channel power meter 720, the measured pre-combiner RF power level for the second channel is provided by second input power sensor 820 to channel power meter 720, and the measured post-combiner RF power level for the second channel is provided by output power sensor 835 to channel power meter 720.

In block 930, the combiner loss level for the first channel is calculated using channel power meter 720, by calculating the difference between the pre-combiner RF power level for the first channel and the post-combiner RF power level for the first channel.

In block 935, the combiner loss level for the second channel is calculated, using channel power meter 720, by calculating the difference between the pre-combiner RF power level for the second channel and the post-combiner RF power level for the second channel.

In block 940, the calculated combiner loss level for the first channel and the calculated combiner loss level for the second channel are displayed to the user by channel power meter 720. In an exemplary embodiment, channel power meter 720 displays the calculated combiner loss level for the first channel and the calculated combiner loss level for the second channel using display 724 of user I/O 726.

Figure 19:
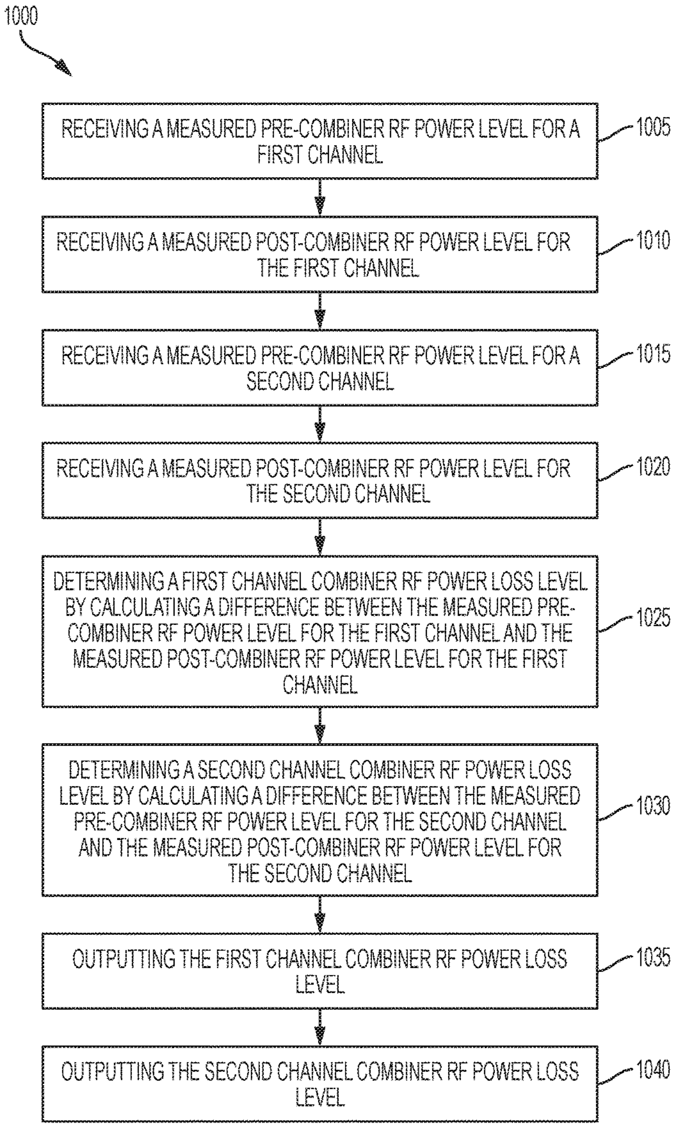
FIG. 19 is a flow chart of a program for calculating loss in a combiner stored in memory 725 and executed by processor 722 of channel power meter 720 of RF system with the RF power sensor having a non-directional coupler in accordance with an exemplary embodiment of the invention.

FIG. 19 is a flowchart of a program 1000 for calculating loss in a combiner 825 stored in memory 725 and executed by processor 722 of channel power meter 720 in an exemplary embodiment of RF power metering system 800, and will be described with reference to FIGS. 16-17.

In block 1005 a measured pre-combiner RF power level for a first channel is received by processor 722 and stored in memory 725. In some exemplary embodiments, the measured pre-combiner RF power level for a first channel is received by channel power meter 720 in the form of a scaled DC voltage representative of the energy travelling on first channel transmission line 805 (RF power level for the first channel before entering combiner 825). Measured pre-combiner RF power level for the first channel is measured by and received from first input power sensor 810. First input power sensor 810 can be a non-directional power sensor, such as RF power sensor 100. The measured pre-combiner RF power level for the first channel is the RF power level on the first channel transmission line 805.

In block 1010, a measured post-combiner RF power level for a first channel is received by processor 722 and stored in memory 725. Measured post-combiner RF power level for the first channel is measured by and received from output power sensor 835. In some exemplary embodiments, the measured post-combiner RF power level for a first channel is a received by channel power meter 720 in the form of a scaled DC voltage representative of the energy travelling on combined channel transmission line 830 for the first channel (RF power level for the first channel after exiting combiner 825). In an exemplary embodiment, output power sensor 835 can be any device that is capable of determining directional channelized power, such as a spectrum analyzer. Output power sensor 835 can also be a device that is not capable of determining directional channelized power (e.g. a composite power measurement device), as long as only the channel of interest is activated when the RF power level for the channel of interest is being measured. For example, a composite power measurement device can be used as output power sensor 835, if only the first channel is activated during the time the RF power level for the first channel is being measured, and only the second channel is activated during the time the RF power level for the second channel is being measured. The measured post-combiner RF power level for the first channel is the RF power level for the first channel on combined channel transmission line 830.

In block 1015, a measured pre-combiner RF power level for a second channel is received by processor 722 and stored in memory 725. In some exemplary embodiments, the measured pre-combiner RF power level for a second channel is a received by channel power meter 720 in the form of a scaled DC voltage representative of the energy travelling on second channel transmission line 815 (RF power level for the second channel before entering combiner 825). Measured pre-combiner RF power level for the second channel is measured by and received from second input power sensor 820. Second input power sensor 820 can be a non-directional power sensor, such as RF power sensor 100. The measured pre-combiner RF power level for the second channel is the RF power level on the second channel transmission line 815.

In block 1020, a measured post-combiner RF power level for a second channel is received by processor 722 and stored in memory 725. In some exemplary embodiments, the measured post-combiner RF power level for a second channel is a received by channel power meter 720 in the form of a scaled DC voltage representative of the energy travelling on combined channel transmission line 830 for the second channel (RF power level for the second channel after exiting combiner 825). Measured-post combiner RF power level for the second channel is measured by and received from output power sensor 835. In an exemplary embodiment, output power sensor 835 can be any device that is capable of determining directional channelized power, such as a spectrum analyzer. Output power sensor 835 can also be a device that is not capable of determining directional channelized power (e.g. a composite power measurement device), as long as only the channel of interest is activated when the RF power level for the channel of interest is being measured. For example, a composite power measurement device can be used as output power sensor 835, if only the first channel is activated during the time the RF power level for the first channel is being measured, and only the second channel is activated during the time the RF power level for the second channel is being measured. The measured post-combiner RF power level for the second channel is the RF power level for the second channel on combined channel transmission line 830.

In block 1025, a first channel combiner RF power loss level is determined by processor 722 by retrieving the measured pre-combiner RF power level for the first channel from memory 725, retrieving the measured post-combiner RF power level for the first channel from memory 725, calculating the difference between the measured pre-combiner RF power level for the first channel and the measured post-combiner RF power level for the first channel, and storing the difference in memory 725 as the first channel combiner RF power loss level.

In block 1030, a second channel combiner RF power loss level is determined by processor 722 by retrieving the measured pre-combiner RF power level for the second channel from memory 725, retrieving the measured post-combiner RF power level for the second channel from memory 725, calculating the difference between the measured pre-combiner RF power level for the second channel and the measured post-combiner RF power level for the second channel, and storing the difference in memory 725 as the second channel combiner RF power loss level.

In block 1035, the first channel combiner RF power loss level is retrieved from memory 725 by processor 722 and outputted to the user. Processor 722 can output the first channel combiner RF power loss level to a user by utilizing user I/O 726. In an exemplary embodiment, processor 722 can output for display, the first channel combiner RF power loss level to a user by utilizing display 724 of user I/O 726.

In block 1040, the second channel combiner RF power loss level is retrieved from memory 725 by processor 722 and outputted to the user. Processor 722 can output the second channel combiner RF power loss level to a user by utilizing user I/O 726. In an exemplary embodiment, processor 722 can output for display, the second channel combiner RF power loss level to a user by utilizing display 724 of user I/O 726.

In an exemplary embodiment, processor 722 can receive the measured pre-combiner RF power level for the first channel, measured post-combiner RF power level for the first channel, measured pre-combiner RF power level for the second channel, and measured post-combiner RF power level for the second channel through port 721 of channel power meter 720.

Figure 20:
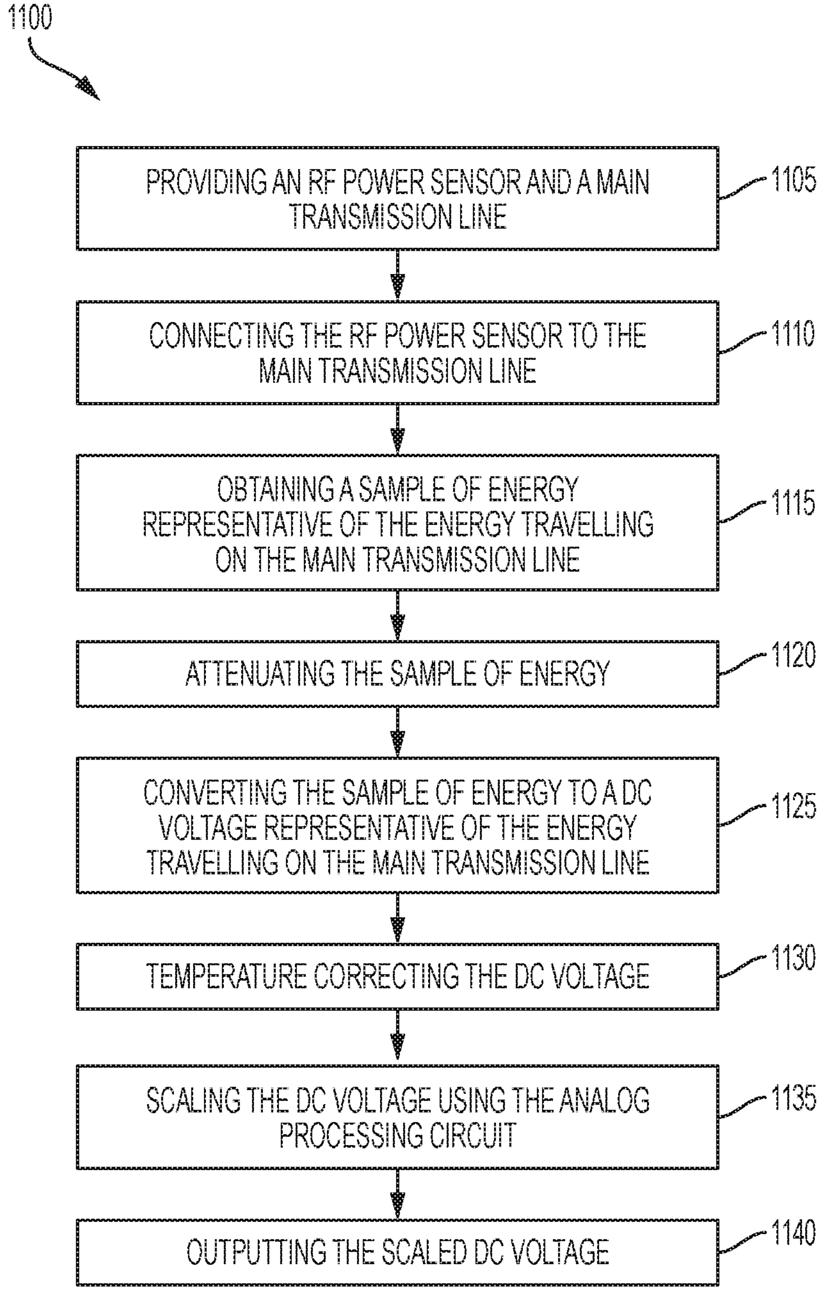
FIG. 20 is a flow chart of a method of using RF power sensor having a non-directional coupler in accordance with an exemplary embodiment of the invention.

FIG. 20 is a flow chart of a method 1100 of using RF power sensor 100. In block 1105, RF power sensor 100 and a main transmission line 600 are provided. In block 1110, RF power sensor 100 is connected to the main transmission line 600. In block 1115, a sample of energy travelling on main transmission line 600 is obtained by RF power sensor 100, using a non-directional coupler 700.

In block 1120, analog processing circuit 710 of RF power sensor 100 attenuates the sample of energy obtained by non-directional coupler 700 into an attenuated sample of energy. In an exemplary embodiment, analog processing circuit 710 of RF power sensor 100 converts the sample of energy into the attenuated sample of energy using resistive attenuator 525.

In block 1125, analog processing circuit 710 of RF power sensor 100 converts the attenuated sample of energy obtained by non-directional coupler 700 into a DC voltage representative of the energy travelling on main transmission line 600, thereby producing an analog DC voltage. In an exemplary embodiment, analog processing circuit 710 of RF power sensor 100 converts the attenuated sample of energy into the analog DC voltage, using square-law detector 530.

In block 1130, the analog processing circuit 710 temperature corrects the analog DC voltage, thereby producing a temperature corrected DC voltage. In an exemplary embodiment, analog processing circuit 710 of RF power sensor 100 temperature corrects the analog DC voltage, using a first analog gain stage 535.

In block 1135, the analog processing circuit 710 scales the temperature corrected DC voltage, thereby producing a scaled DC voltage. In an exemplary embodiment, analog processing circuit 710 of RF power sensor 100 scales the temperature corrected DC voltage, using a second analog gain stage 540.

In block 1140, the scaled DC voltage is outputted by analog processing circuit 710. In one exemplary embodiment, analog processing circuit 710 of RF power sensor 100 outputs the scaled DC voltage, using port 550.

While this invention has been described in conjunction with the specific embodiments described above, it is evident that many alternatives, combinations, modifications and variations are apparent to those skilled in the art. Accordingly, the preferred embodiments of this invention, as set forth above are intended to be illustrative only, and not in a limiting sense. Various changes can be made without departing from the spirit and scope of this invention. Combinations of the above embodiments and other embodiments will be apparent to those of skill in the art upon studying the above description and are intended to be embraced therein. Therefore, the scope of the present invention is defined by the appended claims, and all devices, processes, and methods that come within the meaning of the claims, either literally or by equivalence, are intended to be embraced therein.

The invention claimed is:

1. A radio frequency (RF) power sensor comprising:
 a non-directional coupler and an analog processing circuit;
 said non-directional coupler is a capacitive non-directional coupler and comprised of a non-directional coupler printed circuit board (PCB) and a capacitive attenuator;
 said non-directional coupler PCB is comprised of a coupler section configured to carry energy travelling on a main transmission line;
 wherein said non-directional coupler PCB and said capacitive attenuator are configured as a capacitive voltage divider and provide a sample of the energy on said main transmission line.

2. The RF power sensor as set forth in claim 1, wherein said coupler section is a microstripline.

3. The RF power sensor as set forth in claim 1, wherein a front side of said non-directional coupler PCB is comprised of said coupler section, a reverse side of said non-directional coupler PCB is comprised of a printed metallic structure, and a di-electric material located between said coupler section and said printed metallic structure;
 at least a portion of said coupler section and said printed metallic structure overlap; and
 said coupler section and said printed metallic structure are configured to couple when said RF power is present on said coupler section.

4. The RF power sensor as set forth in claim 3, wherein said capacitive attenuator is electrically connected to said printed metallic structure and configured as a shunt capacitor;
 wherein a power transfer member electrically connects said printed metallic structure and said capacitive attenuator.

5. The RF power sensor as set forth in claim 4, wherein said power transfer member is configured to electrically connect said printed metallic structure and said capacitive attenuator,
 wherein said capacitive attenuator is located at a base of said power transfer member and a distal end of said power transfer member is electrically connected to said printed metallic structure.

6. The RF power sensor as set forth in claim 4, wherein said power transfer member is configured to electrically connect said printed metallic structure and said capacitive attenuator,
 wherein said capacitive attenuator is located at a base of said power transfer member and a distal end of said power transfer member contacts said printed metallic structure.

7. The RF power sensor as set forth in claim 4, wherein said printed metallic structure is a circular dot;
 wherein said power transmission member is flexible;
 wherein said power transmission member is a wire, pin, and/or telescoping pin;
 wherein said capacitive attenuator is a distributed capacitor.

8. The RF power sensor as set forth in claim 3, wherein said printed metallic structure has a diameter of 0.125 inches;
 wherein a length of said non-directional coupler PCB is about 0.3 inches and the width of said non-directional coupler PCB is about 0.4 inches;
 wherein a thickness of said non-directional coupler PCB di-electric material is about 0.020 inches;
 wherein said coupler section has a width of about 0.050 inches and a length of about 0.300 inches.

9. The RF power sensor as set forth in claim 1, wherein said analog processing circuit is configured to receive said sample of the energy on said main transmission line and covert said sample of energy to a DC voltage for output;
 wherein said DC voltage is a scaled DC voltage representative of the energy travelling on the main transmission line.

10. The RF power sensor as set forth in claim 9, wherein said analog processing circuit is comprised of a resistive attenuator, a square law detector, a first analog gain stage, a second analog gain stage, and a port;
 said resistive attenuator is configured to receive said sample of the energy on said main transmission line from said capacitive non-directional coupler and convert said sample of the energy to an attenuated sample of energy;
 said square law detector is configured to receive said attenuated sample of the energy and convert said attenuated sample of the energy to an analog DC voltage;
 said first analog gain stage is configured to receive said analog DC voltage, apply a gain with a temperature correction to said analog DC voltage, thereby producing a temperature corrected DC voltage; the amount of temperature correction applied by said first analog gain stage is determined by an output of a temperature compensation circuit;
 said second analog gain stage is configured to receive and scale said temperature corrected DC voltage, thereby producing a scaled DC voltage; and
 said port is configured to receive said scaled DC voltage and output said scaled DC voltage.

11. A method of using a radio frequency (RF) power sensor comprising:
 providing an RF power sensor and a main transmission line, said RF power sensor is comprised of a non-directional coupler and an analog processing circuit;
 connecting said RF power sensor to said main transmission line; and
 obtaining a sample of energy on said main transmission line using said non-directional coupler;
 wherein said non-directional coupler is a capacitive non-directional coupler and comprised of a non-directional coupler printed circuit board (PCB) and a capacitive attenuator;
 said non-directional coupler PCB is comprised of a coupler section configured to carry the energy on the main transmission line; and
 said non-directional coupler PCB and said capacitive attenuator are configured as a capacitive voltage divider and provide the sample of the energy on said main transmission line.

12. The method of claim 11, wherein said method further includes converting said sample of the energy to a scaled DC voltage representative of the energy travelling on the main transmission line and outputting said scaled DC voltage.

13. The method of claim 11, wherein said coupler section is a microstripline.

14. The method of claim 11, wherein a front side of said non-directional coupler PCB is comprised of said coupler section, a reverse side of said non-directional coupler PCB is comprised of a printed metallic structure, and a di-electric material located between said coupler section and said printed metallic structure;

at least a portion of said coupler section and said printed metallic structure overlap; and said coupler section and said printed metallic structure are configured to couple when said RF power is present on said coupler section;

wherein said capacitive attenuator is electrically connected to said printed metallic structure and configured as a shunt capacitor.

15. The method of claim 14, wherein a power transfer member electrically connects said printed metallic structure and said capacitive attenuator;

wherein said RF power sensor further comprises a power transfer member configured to electrically connect said printed metallic structure and said capacitive attenuator, wherein said capacitive attenuator is located at a base of said power transfer member and a distal end of said power transfer member is electrically connected to said printed metallic structure.

16. The method of claim 15, wherein said power transfer member is configured to electrically connect said printed metallic structure and said capacitive attenuator, wherein said capacitive attenuator is located at a base of said power transfer member and a distal end of said power transfer member contacts said printed metallic structure.

17. The method of claim 15, wherein said printed metallic structure is a circular dot;

wherein said power transmission member is flexible;

wherein said power transmission member is a wire, a pin, and/or a telescoping pin;

wherein said capacitive attenuator is a distributed capacitor.

18. The method of claim 14, wherein said printed metallic structure has a diameter of 0.125 inches;

a length of said non-directional coupler PCB is about 0.3 inches and the width of said non-directional coupler PCB is about 0.4 inches;

wherein a thickness of said non-directional coupler PCB di-electric material is about 0.020 inches;

wherein said coupler section has a width of about 0.050 inches and a length of about 0.300 inches.

19. The method of claim 11, wherein said analog processing circuit is configured to receive said sample of the energy on said main transmission line and covert said sample of energy to a DC voltage for output;

wherein said DC voltage is a scaled DC voltage representative of the energy travelling on the main transmission line.

20. The method of claim 19, wherein said analog processing circuit is comprised of a resistive attenuator, a square law detector, a first analog gain stage, a second analog gain stage, a temperature compensation circuit, and a port;

wherein the method further comprises:

converting said attenuated sample of the energy to an analog DC voltage using said square law detector;

converting said analog DC voltage to a temperature corrected DC voltage by applying a gain and a temperature correction to said analog DC voltage using said first analog gain stage, the gain of said first analog gain stage is determined by an output of the temperature compensation circuit;

converting said temperature corrected DC voltage to a scaled DC voltage using said second analog gain stage; and outputting said scaled DC voltage using said port.

* * * * *